(12) United States Patent
Kohama

(10) Patent No.: US 11,721,596 B2
(45) Date of Patent: Aug. 8, 2023

(54) PARAMETER ADJUSTMENT METHOD OF BONDING APPARATUS AND BONDING SYSTEM

(71) Applicant: Tokyo Electron Limited, Tokyo (JP)

(72) Inventor: Norifumi Kohama, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 319 days.

(21) Appl. No.: 17/269,366

(22) PCT Filed: Aug. 20, 2019

(86) PCT No.: PCT/JP2019/032383
§ 371 (c)(1),
(2) Date: Feb. 18, 2021

(87) PCT Pub. No.: WO2020/045158
PCT Pub. Date: Mar. 5, 2020

(65) Prior Publication Data
US 2021/0327773 A1    Oct. 21, 2021

(30) Foreign Application Priority Data
Aug. 29, 2018 (JP) ................................. 2018-160051

(51) Int. Cl.
*H01L 23/00* (2006.01)
*H01L 21/66* (2006.01)

(52) U.S. Cl.
CPC ............ *H01L 22/26* (2013.01); *H01L 24/75* (2013.01); *H01L 24/83* (2013.01); *H01L 2224/75901* (2013.01); *H01L 2224/83893* (2013.01)

(58) Field of Classification Search
CPC .......... H01L 24/75; H01L 24/83; H01L 22/26
See application file for complete search history.

(56) References Cited

U.S. PATENT DOCUMENTS

2014/0311653 A1* 10/2014 Nakamura .............. H01L 21/68
156/64

FOREIGN PATENT DOCUMENTS

| JP | 2013-120901 A | 6/2013 |
| JP | 2014-041957 A | 3/2014 |

(Continued)

OTHER PUBLICATIONS

International Search Report for PCT/JP2019/032383 dated Oct. 1, 2019.

*Primary Examiner* — Mohammad M Choudhry
(74) *Attorney, Agent, or Firm* — Pearne & Gordon LLP

(57) ABSTRACT

A parameter adjustment method includes an acquisition process and a parameter changing process. The acquisition process acquires, from an inspection apparatus configured to inspect a combined substrate in which the first substrate and the second substrate are bonded by the bonding apparatus, an inspection result indicating a direction and a degree of distortion occurring in the combined substrate. The parameter changing process changes at least one of multiple parameters including at least one of the gap, an attraction pressure of the first substrate by the first holder, an attraction pressure of the second substrate by the second holder or a pressing force on the first substrate by the striker, based on trend information indicating a tendency of a change in the direction and the degree of the distortion when each of the multiple parameters is changed and the inspection result acquired in the acquiring of the inspection result.

9 Claims, 15 Drawing Sheets

(56) References Cited

FOREIGN PATENT DOCUMENTS

| JP | 2015-095579 A | 5/2015 |
| JP | 2018-093018 A | 6/2018 |
| WO | 2017/155002 A1 | 9/2017 |

* cited by examiner

FIG. 12

| SETTING INFORMATION ||
|---|---|
| PARAMETER TYPE | PARAMETER VALUE |
| INTER-SUBSTRATE GAP | aaa |
| ATTRACTION DIRECTION | bbb |
| FIRST SUBSTRATE ATTRACTION PRESSURE | ccc |
| SECOND SUBSTRATE ATTRACTION PRESSURE | ddd |
| STRIKER PRESSURE | eee |
| ATTRACTION RELEASE TIMING | fff |

FIG. 16

| INTER-SUBSTRATE GAP | ATTRACTION DIRECTION | TREND INFORMATION FIRST SUBSTRATE ATTRACTION PRESSURE | SECOND SUBSTRATE ATTRACTION PRESSURE | STRIKER PRESSURE | ATTRACTION RELEASE TIMING |
|---|---|---|---|---|---|
| NARROW → WIDE | 45° → ENTIRE CIRCUMFERENCE | STRONG → WEAK | STRONG → WEAK | WEAK → STRONG | SLOW → FAST |
| WIDE → NARROW | ENTIRE CIRCUMFERENCE → 45° | WEAK → STRONG | WEAK → STRONG | STRONG → WEAK | FAST → SLOW |

PARAMETER ADJUSTMENT METHOD OF BONDING APPARATUS AND BONDING SYSTEM

CROSS-REFERENCE TO RELATED APPLICATION

This Application is a U.S. national phase application under 35 U.S.C. § 371 of PCT Application No. PCT/JP2019/032383 filed on Aug. 20, 2019, which claims the benefit of Japanese Patent Application No. 2018-160051 filed on Aug. 29, 2018, the entire disclosures of which are incorporated herein by reference.

TECHNICAL FIELD

The various aspects and exemplary embodiments described herein pertain generally to a parameter adjustment method of a bonding apparatus and a bonding system.

BACKGROUND

Conventionally, there has been known a bonding apparatus for bonding substrates, such as semiconductor wafers, by an intermolecular force.

Such a bonding apparatus presses a central portion of an upper substrate by bringing the central portion of the upper substrate into contact with a central portion of a lower substrate. Thus, the central portions of the upper substrate and the lower substrate are bonded to each other by an intermolecular force to form a bonding region, and the bonding region is expanded toward an outer peripheral portion of the substrate. Accordingly, the upper substrate and the lower substrate are bonded to each other (see Patent Document 1).

Patent Document 1: Japanese Patent Laid-open Publication No. 2015-095579

SUMMARY

In one exemplary embodiment, a parameter adjustment method of a bonding apparatus is provided. The bonding apparatus includes a first holder configured to attract and hold a first substrate from above; a second holder placed under the first holder and configured to attract and hold a second substrate from below; an adjustment device configured to adjust a gap between the first holder and the second holder; and a striker configured to press a central portion of the first substrate from above to be brought into contact with the second substrate. The bonding apparatus is configured to bond the first substrate and the second substrate to each other by adjusting the gap with the adjustment device and then bringing the central portion of the first substrate attracted and held by the first holder into contact with the second substrate attracted and held by the second holder with the striker. The parameter adjustment method includes acquiring, from an inspection apparatus configured to inspect a combined substrate in which the first substrate and the second substrate are bonded by the bonding apparatus, an inspection result indicating a direction and a degree of distortion occurring in the combined substrate; and changing at least one of multiple parameters including at least one of the gap, an attraction pressure of the first substrate by the first holder, an attraction pressure of the second substrate by the second holder or a pressing force on the first substrate by the striker, based on trend information indicating a tendency of a change in the direction and the degree of the distortion when each of the multiple parameters is changed and the inspection result acquired in the acquiring of the inspection result.

BRIEF DESCRIPTION OF THE DRAWINGS

FIG. 12 is a diagram illustrating an example of setting information stored in a storage unit of a control device.

FIG. 16 is a diagram illustrating an example of trend information.

DETAILED DESCRIPTION

Figure 1:
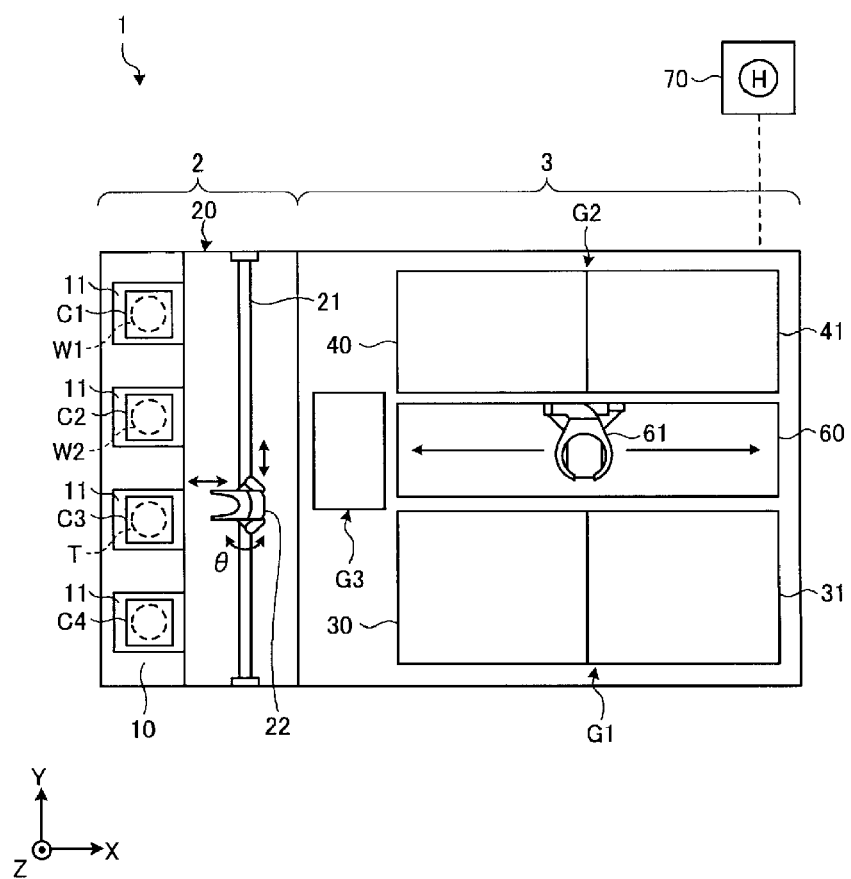
FIG. 1 is a schematic diagram illustrating a configuration of a bonding system according to an exemplary embodiment.

Hereinafter, embodiments (hereinafter, referred to as "exemplary embodiments") of a parameter adjustment method of a bonding apparatus and a bonding system according to the present disclosure will be described in detail with reference to the accompanying drawings. Further, the parameter adjustment method of the bonding apparatus and the bonding system of the present disclosure are not limited to the following exemplary embodiments. Furthermore, the exemplary embodiments can be appropriately combined as long as processing contents are not contradictory to each other. Also, in each of the exemplary embodiments described below, same parts will be assigned same reference numerals, and redundant description will be omitted.

Further, in each of the accompanying drawings, for the purpose of clear understanding, there may be used a rectangular coordinate system in which the X-axis direction, Y-axis direction and Z-axis direction which are orthogonal to one another are defined and the positive Z-axis direction is defined as a vertically upward direction. Furthermore, a rotation direction around a vertical axis is also referred to as θ direction.

<Bonding System>

Figure 2:
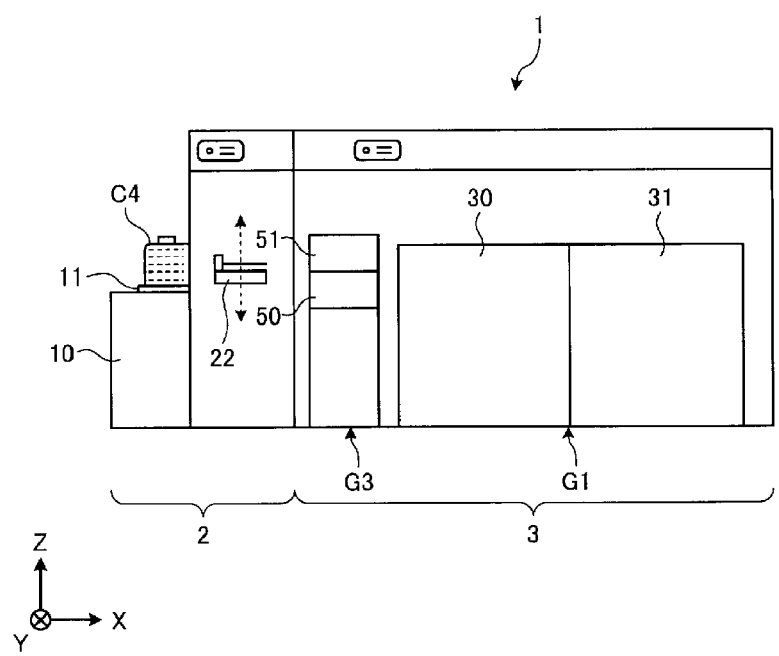
FIG. 2 is a schematic diagram illustrating the configuration of the bonding system according to the exemplary embodiment.

First, a configuration of a bonding system according to the exemplary embodiment will be described with reference to FIG. 1 to FIG. 3. FIG. 1 and FIG. 2 are schematic diagrams illustrating the configuration of the bonding system according to the exemplary embodiment. Further, FIG. 3 is a schematic diagram illustrating a state of a first substrate and a second substrate before being bonded to each other according to the exemplary embodiment.

Figure 3:
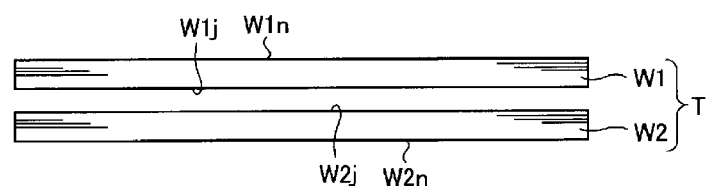
FIG. 3 is a schematic diagram illustrating a state of a first substrate and a second substrate before being bonded to each other according to the exemplary embodiment.

A bonding system 1 shown in FIG. 1 forms a combined substrate T by bonding a first substrate W1 and a second substrate W2 (see FIG. 3).

The first substrate W1 and the second substrate W2 are, for example, semiconductor substrates, such as silicon wafers or compound semiconductor wafers, on which a plurality of electronic circuits is formed. The first substrate W1 and the second substrate W2 have approximately the same diameter. The second substrate W2 may be, for example, a bare wafer on which no electronic circuit is formed.

Hereinafter, as shown in FIG. 3, between plate surfaces of the first substrate W1, a plate surface to be bonded to the second substrate W2 will be referred to as "bonding surface W1$j$" and a plate surface opposite to the bonding surface W1$j$ will be referred to as "non-bonding surface W1$n$." Likewise, between plate surfaces of the second substrate W2, a plate surface to be bonded to the first substrate W1 will be referred to as "bonding surface W2$j$" and a plate surface opposite to the bonding surface W2$j$ will be referred to as "non-bonding surface W2$n$".

As shown in FIG. 1, the bonding system 1 includes a carry-in/out station 2 and a processing station 3. The carry-in/out station 2 is placed on the negative side in the X-axis direction side of the processing station 3 and is integrally connected to the processing station 3.

The carry-in/out station 2 includes a placing table 10 and a transfer section 20. The placing table 10 includes a plurality of placing plates 11. Cassettes C1 to C4 each accommodating therein a plurality of (for example, 25) substrates horizontally are placed on the placing plates 11, respectively. The cassette C1 can accommodate therein a plurality of first substrates W1, the cassette C2 can accommodate therein a plurality of second substrates W2 and the cassette C3 can accommodate therein a plurality of combined substrates T. The cassette C4 is, for example, a cassette for collecting a defective substrate. The number of cassettes C1 to C4 placed on the placing plates 11 is not limited to the illustrated one.

The transfer section 20 is placed adjacent to the positive side in the X-axis direction of the placing table 10. In the transfer section 20, a transfer path 21 extended in the Y-axis direction and a transfer device 22 configured to be movable along the transfer path 21 are provided. The transfer device 22 is movable in the X-axis direction as well as in the Y-axis direction and pivotable around the Z-axis. The transfer device 22 transfers the first substrate W1, the second substrate W2 and the combined substrate T between the cassettes C1 to C4 placed on the placing plates 11 and a third processing block G3 of the processing station 3 to be described later.

In the processing station 3, for example, three processing blocks G1, G2 G3 are provided. The first processing block G1 is placed on the front side of the processing station 3 (on the negative side in the Y-axis direction of FIG. 1). The second processing block G2 is placed on the rear side of the processing station 3 (on the positive side in the Y-axis direction of FIG. 1), and the third processing block G3 is placed on the carry-in/out station 2 side in the processing station 3 (on the negative side in the X-axis direction of FIG. 1).

The first processing block G1 is provided with a surface modifying apparatus 30 configured to modify the bonding surfaces W1$j$ and W2$j$ of the first substrate W1 and the second substrate W2. In the surface modifying apparatus 30, the SiO$_2$ bond on the bonding surfaces W1$j$ and W2$j$ of the first substrate W1 and the second substrate W2 is cut to be turned into SiO of a single bond, and, thus, the bonding surfaces W1$j$ and W2$j$ are modified to be easily hydrophilized afterwards.

Specifically, in the surface modifying apparatus 30, for example, an oxygen gas or a nitrogen gas as a processing gas is excited into plasma and ionized under a decompressed atmosphere. Then, as these oxygen ions or nitrogen ions are radiated to the bonding surfaces W1$j$ and W2$j$ of the first substrate W1 and the second substrate W2, the bonding surfaces W1$j$ and W2$j$ are plasma-processed to be modified.

The first processing block G1 is provided with an inspection apparatus 31 configured to inspect a bonding state of the combined substrate T in which the first substrate W1 and the second substrate W2 are bonded by a bonding apparatus 41 to be described later.

For example, the inspection apparatus 31 captures images of patterns formed on the first substrate W1 and the second substrate W2 with infrared rays, and calculates a deviation between the patterns on the first substrate W1 and the second substrate W2 based on the captured images.

There are two types of pattern deviation: linear deviation and non-linear deviation. The linear deviation refers to uniform deviation, such as "parallel translation", "rotation", "enlargement or reduction", and "inclination (shear displacement)". The inspection apparatus 31 excludes the above-described linear deviation in the deviation occurring in the combined substrate T and outputs the non-linear deviation, i.e., a random deviation occurring in the combined substrate T, as an inspection result to a control device 70 to be described later. Specifically, the inspection result includes a direction and a degree of the random deviation (hereinafter, referred to as "distortion") at each of a plurality of measurement points set on a plate surface of the combined substrate T.

A surface hydrophilizing apparatus 40 and the bonding apparatus 41 are placed in the second processing block G2. The surface hydrophilizing apparatus 40 is configured to hydrophilize the bonding surfaces W1$j$ and W2$j$ of the first substrate W1 and the second substrate W2 and configured to clean the bonding surfaces W1$j$ and W2$j$ with, for example, pure water. Specifically, the surface hydrophilizing apparatus 40 supplies pure water onto the first substrate W1 or the second substrate W2 while rotating the first substrate W1 or the second substrate W2 held on, for example, a spin chuck. Thus, the pure water supplied onto the first substrate W1 or the second substrate W2 spreads on the bonding surface W1j or W2j of the first substrate W1 or the second substrate W2, so that the bonding surface W1j or W2j is hydrophilized.

The bonding apparatus 41 bonds the hydrophilized first substrate W1 and the hydrophilized second substrate W2 by an intermolecular force. The configuration of the bonding apparatus 41 will be described later.

In the third processing block G3, transition (TRS) devices 50 and 51 for the first substrate W1, the second substrate W2 and the combined substrate T are provided in this order from below as shown in FIG. 2.

A transfer section 60 is formed in a region surrounded by the first processing block G1, the second processing block G2 and the third processing block G3. A transfer device 61 is provided in the transfer section 60. The transfer device 61 is equipped with a transfer arm configured to be movable, for example, in a vertical direction, a horizontal direction and pivotable around the vertical axis. The transfer device 61 is moved within the transfer section 60 and transfers the first substrate W1, the second substrate W1 and the combined substrate T to predetermined apparatuses within the first processing block G1, the second processing block G2 and the third processing block G3 which are adjacent to the transfer section 60.

The bonding system 1 also includes the control device 70. The control device 70 controls an operation of the bonding system 1. The control device 70 is, for example, a computer, and includes a non-illustrated controller and a non-illustrated storage unit. The controller includes a microcomputer having a CPU (Central Processing Unit), a ROM (Read Only Memory), a RAM (Random Access Memory), an input/output port and the like, and various kinds of circuits. The CPU of the microcomputer implements a control operation to be described later by reading and executing a program stored in the ROM. The storage unit is implemented by, for example, a semiconductor memory device such a RAM or a flash memory, or a storage device such as a hard disc, an optical disc, or the like.

Further, the program may be recorded on a computer-readable recording medium and installed from the recording medium into the storage unit of the control device 70. Examples of the computer-readable recording medium include a hard disk (HD), a flexible disk (FD), a compact disk (CD), a magneto optical disc (MO), and a memory card.

The controller of the control device 70 includes an acquisition unit configured to acquire an inspection result from the inspection apparatus 31. In addition, the controller includes a display controller configured to cause a non-illustrated display unit to display an image based on the inspection result acquired by the acquisition unit.

Figure 15:
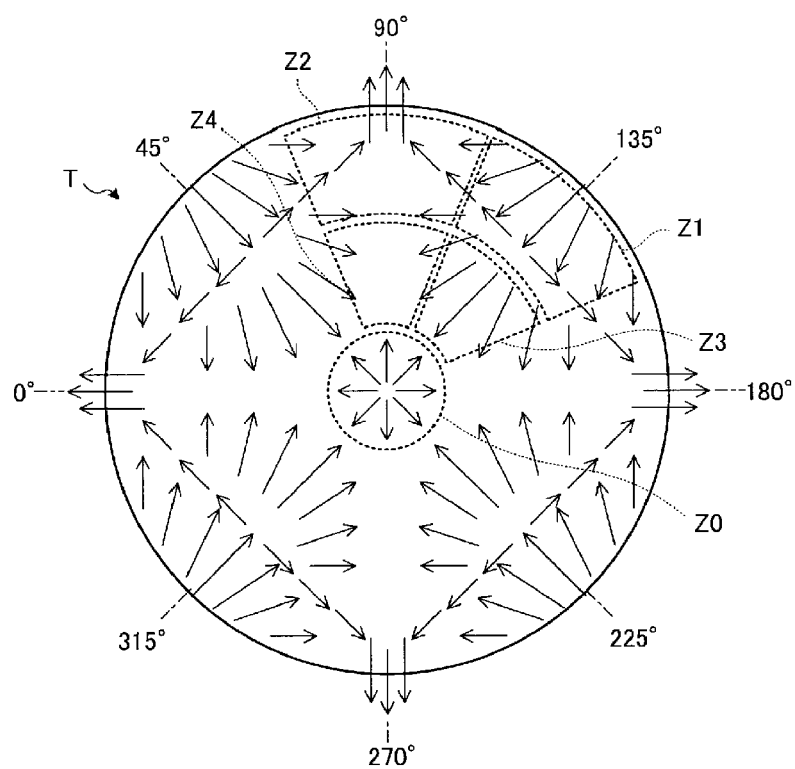
FIG. 15 is a diagram illustrating an example of a plurality of zones set on a plate surface of a combined substrate.

The display controller displays the image in which the direction of distortion at each measurement point is indicated by an arrow and the degree of distortion is indicated by at least one of the length, thickness or color of the arrow (see FIG. 15 to be described later). In the example of FIG. 15, the degree of distortion is indicated by the length of the arrow. By displaying such an image on the display unit, the inspection result from the inspection apparatus 31 can be visually and simply presented to a user.

<Bonding Apparatus>

Figure 4:
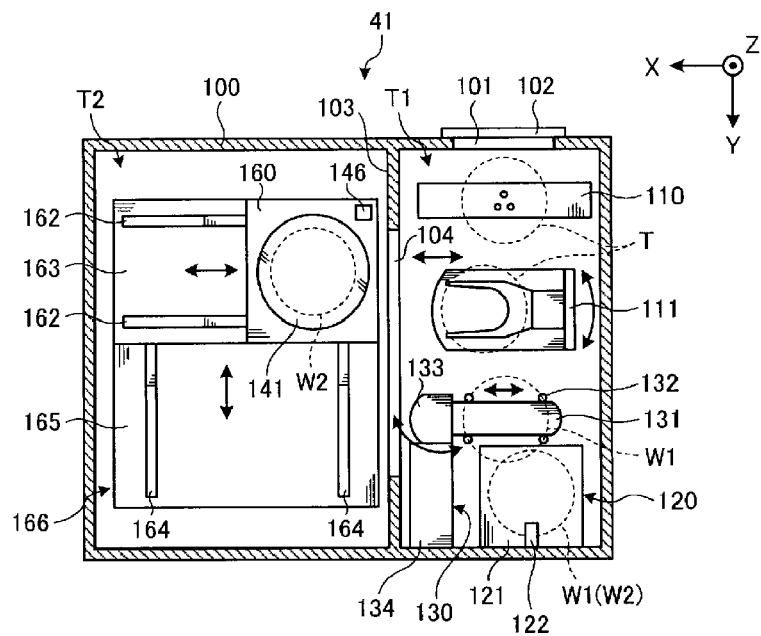
FIG. 4 is a schematic diagram illustrating a configuration of a bonding apparatus according to the exemplary embodiment.
Figure 5:
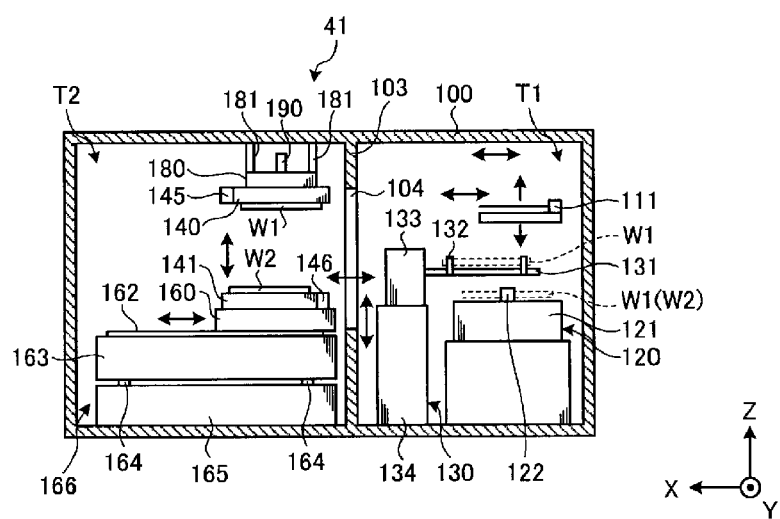
FIG. 5 is a schematic diagram illustrating the configuration of the bonding apparatus according to the exemplary embodiment.

Hereinafter, the configuration of the bonding apparatus 41 will be described with reference to FIG. 4 and FIG. 5. FIG. 4 and FIG. 5 are schematic diagrams illustrating the configuration of the bonding apparatus 41 according to the exemplary embodiment.

As shown in FIG. 4, the bonding apparatus 41 is equipped with a processing container 100 having a hermetically sealable inside. A carry-in/out port 101 for the first substrate W1, the second substrate W2 and the combined substrate T is formed on a lateral side of the processing container 100 at a side of the transfer section 60. The carry-in/out port 101 is provided with an opening/closing shutter 102.

The inside of the processing container 100 is partitioned by an inner wall 103 into a transfer section T1 and a processing section T2. The above-described carry-in/out port 101 is formed on the lateral side of the processing container 100 in the transfer section T1. Further, a carry-in/out port 104 for the first substrate W1, the second substrate W2 and the combined substrate T is also formed on the inner wall 103.

In the transfer section T1, a transition 110, a substrate transfer device 111, a inverting device 130 and a position adjusting device 120 are placed in this order from, for example, the carry-in/out port 101.

The transition 110 temporarily places thereon the first substrate W1, the second substrate W2 and the combined substrate T. The transition 110 has, for example, two levels and is capable of placing thereon any two of the first substrate W1, the second substrate W2 and the combined substrate T at the same time.

As shown in FIG. 4 and FIG. 5, the substrate transfer device 111 is equipped with a transfer arm configured to be movable, for example, in the vertical direction (Z-axis direction), the horizontal direction (Y-axis direction, X-axis direction) and pivotable around the vertical axis (θ direction). The substrate transfer device 111 can transfer the first substrate W1, the second substrate W2 and the combined substrate T within the transfer section T1 or between the transfer section T1 and the processing section T2.

The position adjusting device 120 is configured to adjust a direction of the first substrate W1 and a direction of the second substrate W2 in the horizontal direction. Specifically, the position adjusting device 120 includes a base 121 equipped with a non-illustrated holder configured to hold and rotate the first substrate W1 and the second substrate W2, and a detector 122 configured to detect positions of notches of the first substrate W1 and the second substrate W2. The position adjusting device 120 adjusts the positions of the notches of the first substrate W1 and the second substrate W2 by detecting the positions of the notches with the detector 122 while rotating the first substrate W1 and the second substrate W2 held on the base 121. Accordingly, the direction of the first substrate W1 and the direction of the second substrate W2 in the horizontal direction are adjusted.

The inverting device 130 is configured to invert front and rear surfaces of the first substrate W1. Specifically, the inverting device 130 is equipped with a holding arm 131 configured to hold the first substrate W1. The holding arm 131 is extended in the horizontal direction (X-axis direction). The holding arm 131 is provided with, for example, four holding members 132 configured to hold the first substrate W1.

The holding arm 131 is supported by a driving unit 133 having, for example, a motor. The holding arm 131 is rotatable around a horizontal axis by the driving unit 133. Further, the holding arm 131 is rotatable around the driving unit 133 and is movable in the horizontal direction (X-axis direction). Another driving unit (not illustrated) having, for example, a motor is provided under the driving unit 133.

This another driving unit enables the driving unit 133 to move in the vertical direction along a supporting column 134 extended in the vertical direction.

As described above, the first substrate W1 held by the holding members 132 can be rotated around the horizontal axis by the driving unit 133 and can also move in the vertical direction and the horizontal direction. Further, the first substrate W1 held by the holding members 132 can be rotated around the driving unit 133 to move between the position adjusting device 120 and a first holder 140 to be described later.

The processing section T2 is equipped with the first holder 140 configured to attract and hold an upper surface (non-bonding surface W1n) of the first substrate W1 from above and a second holder 141 configured to attract and hold a lower surface (non-bonding surface W2n) of the second substrate W2 from below. The second holder 141 is provided under the first holder 140 to face the first holder 140. The first holder 140 and the second holder 141 are, for example, vacuum chucks.

As shown in FIG. 5, the first holder 140 is supported by a supporting member 180 provided above the first holder 140. The supporting member 180 is fixed to a ceiling surface of the processing container 100 via, for example, a plurality of supporting columns 181.

An upper imaging device 145 configured to image an upper surface (bonding surface W2j) of the second substrate W2 held by the second holder 141 is provided on the side of the first holder 140. For example, a CCD camera is used as the upper imaging device 145.

The second holder 141 is supported by a first moving device 160 provided under the second holder 141. The first moving device 160 is configured to move the second holder 141 in the horizontal direction (X-axis direction) as will be described later. Further, the first moving device 160 is configured to move the second holder 141 in the vertical direction and to rotate the second holder 141 around the vertical axis.

The first moving device 160 is equipped with a lower imaging device 146 configured to image a lower surface (bonding surface W1j) of the first substrate W1 held by the first holder 140. For example, a CCD camera is used as the lower imaging device 146.

The first moving device 160 is mounted to a pair of rails 162 and 162, which are provided at a lower surface side of the first moving device 160 and extended in the horizontal direction (X-axis direction). The first moving device 160 is configured to be movable along the rails 162.

The pair of rails 162 and 162 are placed on a second moving device 163. The second moving device 163 is mounted to a pair of rails 164 and 164, which are provided on a lower surface side of the second moving device 163 and extend in the horizontal direction (Y-axis direction). The second moving section 163 is configured to be movable in the horizontal direction (Y-axis direction) along the rails 164. Also, the pair of rails 164 and 164 are placed on a placing table 165 provided on a bottom surface of the processing container 100.

A position adjustment device 166 is configured by the first moving device 160, the second moving device 163 and the like. The position adjustment device 166 is configured to move the second holder 141 in the X-axis direction, the Y-axis direction and the θ-direction to adjust the positions of the first substrate W1 held by the first holder 140 and the second substrate W2 held by the second holder 141 in the horizontal direction. In addition, the position adjustment device 166 moves the second holder 141 in the Z-axis direction to adjust the positions of the first substrate W1 held by the first holder 140 and the second substrate W2 held by the second holder 141 in the vertical direction.

Herein, the second holder 141 is moved in the X axis direction, the Y axis direction and the θ direction. However, the position adjustment device 166 may move, for example, the second holder 141 in the X axis direction and the Y axis direction and the first holder 140 in the θ direction. Further, herein, the second holder 141 is moved in the Z-axis direction. However, the position adjustment device 166 may move, for example, the first holder 140 in the Z-axis direction.

Figure 6:
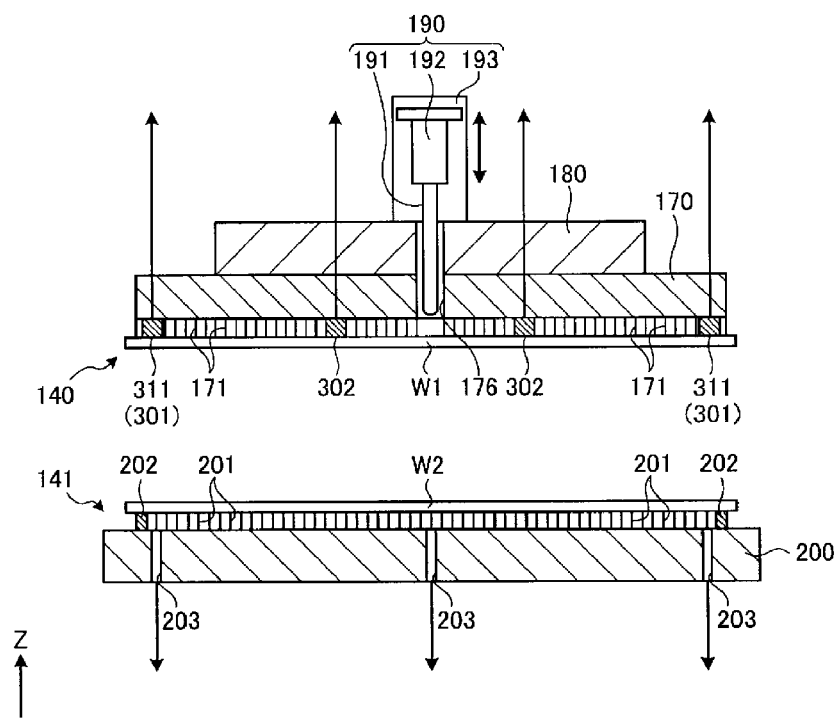
FIG. 6 is a schematic diagram illustrating a first holder and a second holder according to the exemplary embodiment.

Hereinafter, the configurations of the first holder 140 and the second holder 141 will be described with reference to FIG. 6. FIG. 6 is a schematic diagram illustrating the first holder 140 and the second holder 141 according to the exemplary embodiment.

As shown in FIG. 6, the first holder 140 has a main body 170. The main body 170 is supported by the supporting member 180. A through hole 176 is formed through the supporting member 180 and the main body 170 in the vertical direction. The position of the through hole 176 corresponds to a central portion of the first substrate W1 attracted and held by the first holder 140. A pressing pin 191 of a striker 190 is inserted through the through hole 176.

The striker 190 is placed on an upper surface of the supporting member 180 and includes the pressing pin 191, an actuator 192 and a linearly moving mechanism 193. The pressing pin 191 is a cylindrical member extended along the vertical direction and is supported by the actuator 192.

The actuator 192 generates a constant pressure in a certain direction (here, vertically downwards) by air supplied from, for example, an electropneumatic regulator (not illustrated). By the air supplied from the electropneumatic regulator, the actuator 192 can control a press load applied to the central portion of the first substrate W1 as it is brought into contact with the central portion of the first substrate W1. In addition, a tip end of the actuator 192 is movable up and down in the vertical direction through the through hole 176 by the air from the electropneumatic regulator.

The actuator 192 is supported by the linearly moving mechanism 193. The linearly moving mechanism 193 is configured to move the actuator 192 in the vertical direction by, for example, a driving unit having a built-in motor.

The striker 190 is configured as described above and controls a movement of the actuator 192 by the linearly moving mechanism 193 and controls the press load applied to the first substrate W1 from the pressing pin 191 by the actuator 192. Thus, the striker 190 presses the central portion of the first substrate W1 attracted and held by the first holder 140 to be brought into contact with the second substrate W2.

A plurality of pins 171 in contact with the upper surface (non-bonding surface W1n) of the first substrate W1 is provided on a lower surface of the main body 170. The plurality of pins 171 has, for example, a diameter of 0.1 mm to 1 mm and a height of several tens of μm to several hundreds of μm. The plurality of pins 171 is equally arranged at an interval of, for example, 2 mm.

The first holder 140 includes a plurality of attraction members for attracting the first substrate W1 in a part of a region where the plurality of pins 171 is provided. The plurality of attraction members is arranged depending on anisotropy of physical properties of the first substrate W1.

Figure 7:
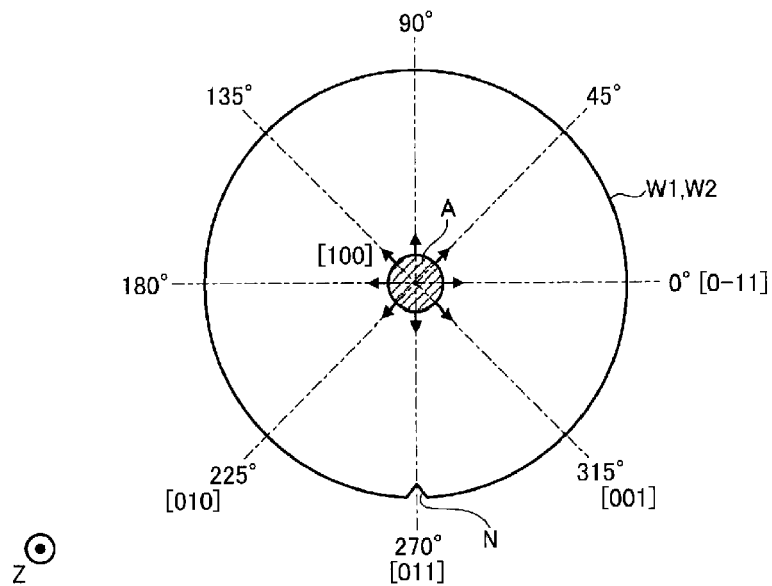
FIG. 7 is a schematic diagram illustrating an example where a bonding region is expanded.
Figure 8:
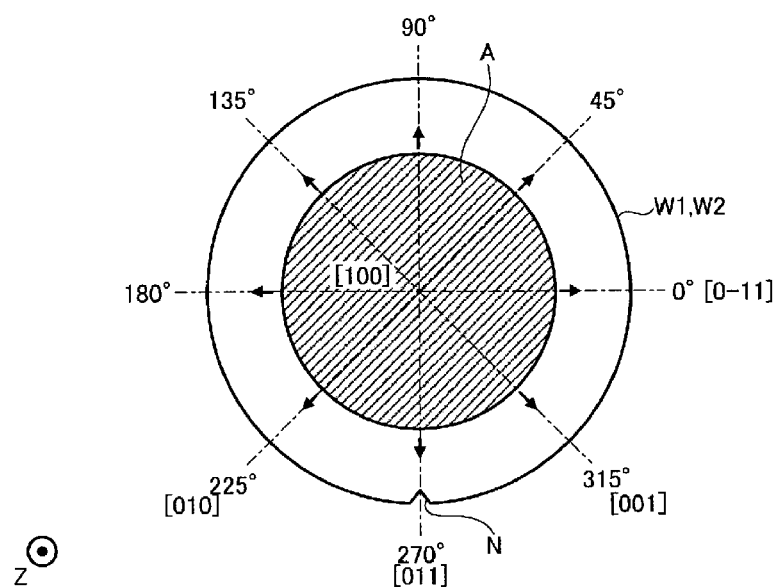
FIG. 8 is a schematic diagram illustrating an example where the bonding region is expanded.
Figure 9:
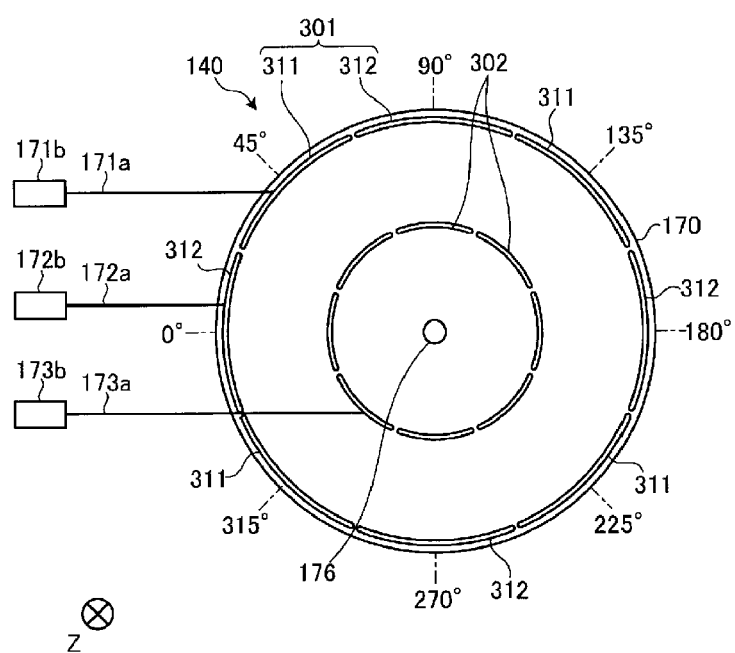
FIG. 9 is a schematic diagram of the first holder when viewed from below according to the exemplary embodiment.

Hereinafter, the plurality of attraction members of the first holder 140 will be described with reference to FIG. 7 to FIG. 9. FIG. 7 and FIG. 8 are schematic diagrams illustrating an example where the bonding region is expanded. FIG. 9 is a schematic diagram of the first holder 140 when viewed from below according to the exemplary embodiment. If a Miller index is of a negative value, a sign "−" (bar) is typically put above the number. In the present specification, however, a minus is put before the number.

As shown in FIG. 7, the first substrate W1 and the second substrate W2 are single crystalline silicon wafers each having a crystal direction of [100] in a direction perpendicular to the surface (bonding surface). Notches N of the first substrate W1 and the second substrate W2 are formed at outer edges of the first substrate W1 and the second substrate W2 in a crystal direction of [011]. Further, the first substrate W1 and the second substrate W2 have a diameter of, for example, 300 mm.

When the central portion of the first substrate W1 is pressed to be brought into contact with the central portion of the second substrate W2, the central portion of the first substrate W1 and the central portion of the second substrate W2 are bonded by the intermolecular force so that a bonding region A is formed at the central portions of the both substrates. Then, a bonding wave is generated and thus the bonding region A is expanded from the central portions toward outer peripheral portions of the both substrates. As a result, the bonding surface W1$j$ of the first substrate W1 and the bonding surface W2$j$ of the second substrate W2 are bonded to each other over the entire surfaces.

When the above-described bonding processing is performed while holding the first substrate W1 using a holding member configured to hold the entire outer edge of the first substrate W1, the bonding region A is concentrically expanded as shown in FIG. 8. However, the first substrate W1 and the second substrate W2, which are the single crystalline silicon wafers, have different physical properties, such as Young's modulus and Poisson's ratio, between a 90° direction and a 45° direction and thus have a difference in the degree of distortion between the 90° direction and the 45° direction. Here, the 90° direction refer to a direction at a cycle of 90° (directions of 0°, 90°, 180° and 270° shown in FIG. 8) with respect to a direction oriented toward a [0-11] crystal direction parallel to the surface of the first substrate W1 from the central portion of the first substrate W1. The 45° direction refer to a direction at a cycle of 90° (directions of 45°, 135°, 225° and 315° shown in FIG. 8) with respect to a direction oriented toward a [010] crystal direction parallel to the surface of the first substrate W1 from the central portion of the first substrate W1.

The values of Young's modulus, Poisson's ratio and shear modulus of the single crystal silicon wafer vary at a cycle of 90°. Specifically, the Young's modulus of the single crystalline silicon wafer is highest in the 90° direction and lowest in the 45° direction. Further, the Poisson's ratio and the shear modulus are highest in the 45° direction and lowest in the 90° direction.

As shown in FIG. 9, a plurality of outer attraction members 301 and a plurality of inner attraction members 302 configured to attract the first substrate W1 by vacuum evacuation are provided on the lower surface of the main body 170 in the first holder 140. The plurality of outer attraction members 301 and the plurality of inner attraction members 302 have circular arc-shaped attraction regions when viewed from the top. Further, the plurality of outer attraction members 301 and the plurality of inner attraction members 302 have the same height as the pins 171.

The plurality of outer attraction members 301 is arranged on an outer peripheral portion of the main body 170 to attract and hold an outer peripheral portion of the first substrate W1. The plurality of outer attraction members 301 includes four first attraction members 311 arranged at an interval of 90° and four second attraction members 312 arranged at an interval of 45° with respect to the four first attraction members 311 in a circumferential direction. The outer peripheral portion of the first substrate W1 refers to a portion within 15% of the radius of the first substrate W1 from an outer edge of the first substrate W1.

The four first attraction members 311 are arranged at an interval of 90° based on the 45° direction to attract and hold the outer peripheral portion of the first substrate W1 in the 45° direction (directions of 45°, 135°, 225° and 315° shown in FIG. 8). Specifically, the four first attraction members 311 are arranged at positions where the centers of the circular arc-shaped attraction regions are coincident with the 45° direction of the first substrate W1.

The four second attraction members 312 are arranged at an interval of 90° based on the 0° direction to attract and hold the outer peripheral portion of the first substrate W1 in the 90° direction (directions of 0°, 90°, 180° and 270°). Specifically, the four second attraction members 312 are arranged at positions where the centers of the circular arc-shaped attraction regions are coincident with the 90° direction of the first substrate W1.

The four first attraction members 311 are connected to a single first vacuum pump 171$b$ via a first suction pipe 171$a$ to attract the first substrate W1 by vacuum evacuation through the first vacuum pump 171$b$. In addition, the four second attraction members 312 are connected to a single second vacuum pump 172$b$ via a second suction pipe 172$a$ to attract the first substrate W1 by vacuum evacuation through the second vacuum pump 172$b$. Here, for the purpose of clear understanding, only a line configuration of any one of the four first attraction members 311 is illustrated. The same applies to the four second attraction members 312.

As described above, the first holder 140 includes the four first attraction members 311 that attract and hold the outer peripheral portion of the first substrate W1 in the 45° direction and the four second attraction members 312 that attract and hold the outer peripheral portion of the first substrate W1 in the 90° direction. For this reason, according to the bonding apparatus 41 of the exemplary embodiment, the outer peripheral portion of the first substrate W1 can be attracted and held along the entire circumference by using, for example, the four first attraction members 311 and the four second attraction members 312. Further, according to the bonding apparatus 41 of the exemplary embodiment, the outer peripheral portion of the first substrate W1 may be attracted and held only in the 45° direction by using only the four first attraction members 311.

The plurality of inner attraction members 302 is arranged side by side along a circumferential direction on a radially inner side of the main body 170 than the plurality of outer attraction members 301. Specifically, the plurality of inner attraction members 302 includes four attraction members 302 arranged in the 45° direction of the first substrate W1 and four attraction members 302 arranged in the 90° direction of the first substrate W1. The plurality of inner attraction members 302 is connected to a single third vacuum pump 173$b$ via a third suction pipe 173$a$ to attract the first substrate W1 by vacuum evacuation through the third vacuum pump 173$b$. Here, for the purpose of clear understanding, only a line configuration of any one of the plurality of inner attraction members 302 is illustrated.

The number and the placement of the first to third vacuum pumps 171$b$ to 173$b$ are not particularly limited. The first to third vacuum pumps 171$b$ to 173$b$ may be provided for each region where an attraction pressure is independently controlled. For example, among eight inner attraction members 302, four inner attraction members 302 arranged in the 45° direction and four inner attraction members 302 arranged in the 90° direction may be connected to different vacuum pumps.

Returning to FIG. 6, the second holder 141 will be described. The second holder 141 has a main body 200 having a diameter equal to or greater than the second substrate W2. Here, the second holder 141 having a larger diameter than the second substrate W2 is illustrated. An upper surface of the main body 200 is a surface facing a lower surface (non-bonding surface W2n) of the second substrate W2.

A plurality of pins 201 in contact with the lower surface (non-bonding surface Wn2) of the second substrate W2 is provided on an upper surface of the main body 200. The plurality of pins 201 has, for example, a diameter of 0.1 mm to 1 mm and a height of several tens μm to several hundred μm. The plurality of pins 201 is equally arranged at an interval of, for example, 2 mm.

Further, on the upper surface of the main body 200, a lower rib 202 is annularly provided outside the plurality of pins 201. The lower rib 202 is annularly formed and supports an outer peripheral portion of the second substrate W2 along the entire circumference.

The main body 200 has a plurality of lower suction ports 203. The plurality of lower suction ports 203 is provided in an attraction region surrounded by the lower rib 202. The plurality of lower suction ports 203 is connected to a non-illustrated suction device, such as a vacuum pump, via a non-illustrated suction pipe.

The second holder 141 is configured to decompress the attraction region surrounded by the lower rib 202 while vacuum-evacuating the attraction region from the plurality of lower suction ports 203. As a result, the second substrate W2 placed on the attraction region is attracted and held by the second holder 141.

Since the lower rib 202 supports the outer peripheral portion of the lower surface of the second substrate W2 along the entire circumference, the second substrate W2 is appropriately vacuum-evacuated to the outer peripheral portion. Thus, the entire surface of the second substrate W2 can be attracted and held. Further, since the lower surface of the second substrate W2 is supported by the plurality of pins 201, the second substrate W2 can be easily separated from the second holder 141 when the vacuum evacuation of the second substrate W2 is released.

<Specific Operation of Bonding System>

As a result of the research conducted by the present inventors, it is found that the direction and the degree of distortion occurring in the combined substrate T are changed by adjusting parameters of the bonding apparatus 41. Therefore, in the bonding system 1 according to the exemplary embodiment, the parameters of the bonding apparatus 41 are automatically adjusted based on trend information indicating a tendency of change in the direction and the degree of distortion when the parameters are changed and the inspection result for the combined substrate T from the inspection apparatus 31.

Figure 10:
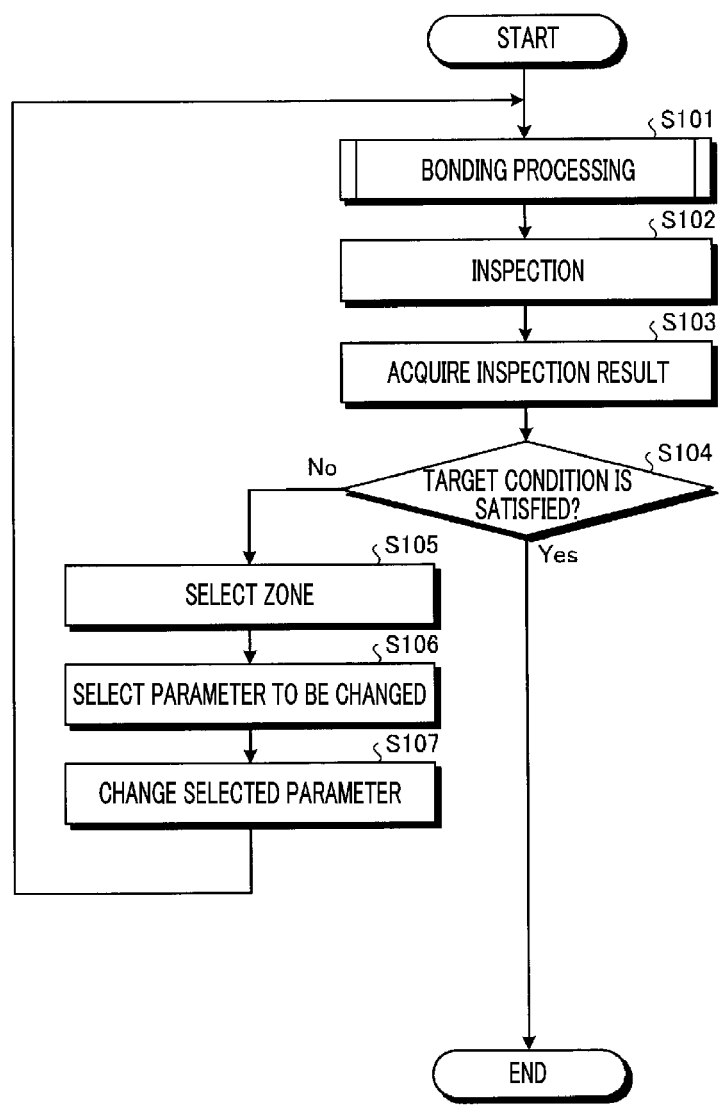
FIG. 10 is a flowchart showing a sequence of a processing performed by the bonding system according to the exemplary embodiment.

Hereinafter, a sequence of an automatically adjusting processing of the parameters of the bonding apparatus 41 performed by the bonding system 1 will be described with reference to FIG. 10. FIG. 10 is a flowchart showing the sequence of the processing performed by the bonding system according to the exemplary embodiment. Further, various processings shown in FIG. 10 are performed under the control of the control device 70.

Figure 11:
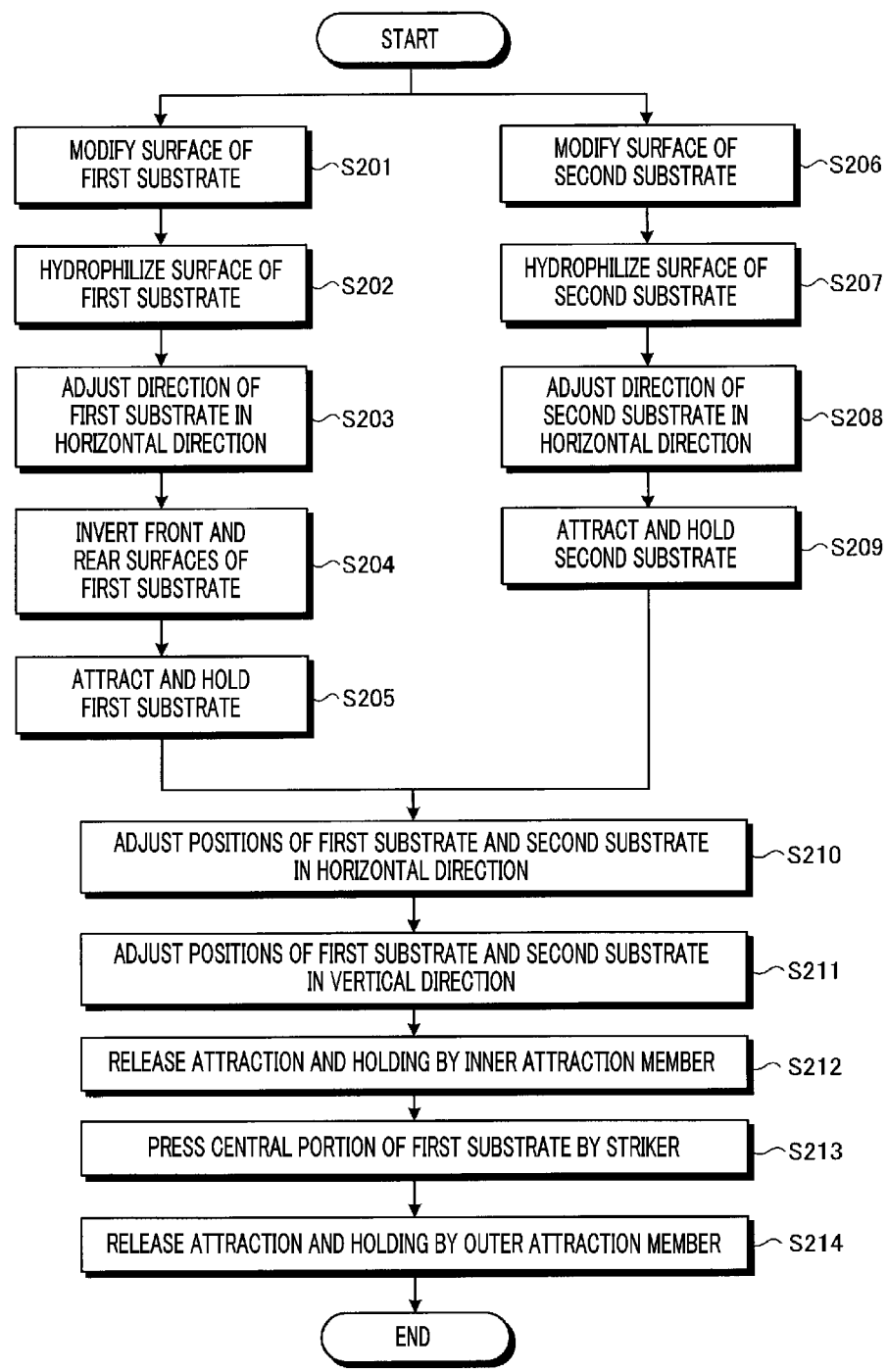
FIG. 11 is a flowchart illustrating a sequence of a bonding processing according to the exemplary embodiment.
Figure 13:
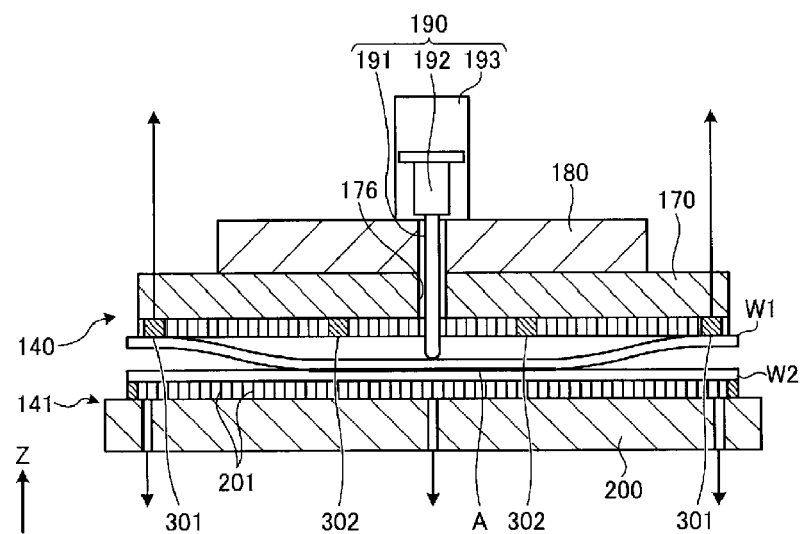
FIG. 13 is a diagram for describing an operation of the bonding processing according to the exemplary embodiment.
Figure 14:
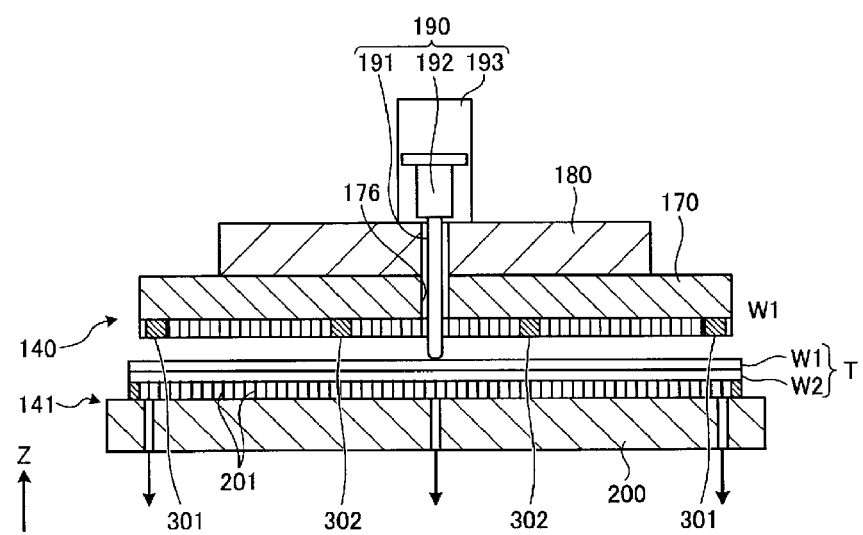
FIG. 14 is a diagram for describing an operation of the bonding processing according to the exemplary embodiment.

As shown in FIG. 10, in the bonding system 1, a bonding processing is performed (process S101). Here, the sequence of the bonding processing will be described with reference to FIG. 11 to FIG. 14. FIG. 11 is a flowchart illustrating the sequence of the bonding processing according to the exemplary embodiment. Further, FIG. 12 is a diagram illustrating an example of setting information stored in the storage unit of the control device 70. Also, FIG. 13 and FIG. 14 are diagrams for describing an operation of the bonding processing according to the exemplary embodiment.

First, the cassette C1 accommodating the plurality of first substrates W1, the cassette C2 accommodating the plurality of second substrates W2 and the empty cassette C3 are placed on predetermined placing plates 11 of the carry-in/out station 2. Then, the first substrate W1 in the cassette C1 is taken out by the transfer device 22 and transferred to the transition device 50 of the third processing block G3 in the processing station 3.

Then, as shown in FIG. 11, the first substrate W1 is transferred to the surface modifying apparatus 30 of the first processing block G1 by the transfer device 61, and the bonding surface W1j is modified in the surface modifying apparatus 30 (process S201). In the surface modifying apparatus 30, an oxygen gas as the processing gas is excited into plasma and ionized under a predetermined decompressed atmosphere. The oxygen ions are radiated to the bonding surface W1j of the first substrate W1 and the bonding surface W1j is plasma-processed. Accordingly, the bonding surface W1j of the first substrate W1 is modified.

Then, the first substrate W1 is transferred by the transfer device 61 to the surface hydrophilizing apparatus 40 of the second processing block G2. In the surface hydrophilizing apparatus 40, pure water is supplied onto the first substrate W1 while rotating the first substrate W1 held on the spin chuck. Then, the supplied pure water spreads on the bonding surface W1j of the first substrate W1, and a hydroxyl group (silanol group) adheres to the bonding surface W1j of the first substrate W1 modified in the surface modifying apparatus 30. Thus, the bonding surface W1j is hydrophilized. Further, the bonding surface W1j of the first substrate W1 is cleaned by the pure water (process S202).

Thereafter, the first substrate W1 is transferred by the transfer device 61 to the bonding apparatus 41 of the second processing block G2. The first substrate W1 carried into the bonding apparatus 41 is transferred to the position adjusting device 120 by the substrate transfer device 111 through the transition 110. Then, the direction of the first substrate W1 in the horizontal direction is adjusted by the position adjusting device 120 (process S203).

Thereafter, the first substrate W1 is delivered from the position adjusting device 120 to the holding arm 131 of the inverting device 130. Then, in the transfer section T1, the front surface and the rear surface of the first substrate W1 are inverted by inverting the holding arm 131 (process S204). That is, the bonding surface W1j of the first substrate W1 faces downwards.

Thereafter, the holding arm 131 of the inverting device 130 rotates and moves to below the first holder 140. Then, the first substrate W1 is delivered from the inverting device 130 to the first holder 140. The non-bonding surface Win of the first substrate W1 is attracted and held by the first holder 140 in a state where the notch N faces a predetermined direction, i.e., a direction in which the second attraction members 312 are provided (process S205). In the process S205, the first holder 140 attracts and holds the first substrate W1 using all of the plurality of outer attraction members 301 and the plurality of inner attraction members 302.

While the processes S201 to S205 are performed onto the first substrate W1, processes are performed onto the second substrate W2. First, the second substrate W2 in the cassette C2 is taken out by the transfer device 22 and transferred to the transition device 50 of the processing station 3.

Then, the second substrate W2 is transferred to the surface modifying apparatus 30 by the transfer device 61, and the bonding surface W2j of the second substrate W2 is modified (process S206). The modification of the bonding surface W2j of the second substrate W2 in a process S206 is performed in the same manner as in the above-described process S201.

Thereafter, the second substrate W2 is transferred to the surface hydrophilizing apparatus 40 by the transfer device 61, and the bonding surface W2j of the second substrate W2 is hydrophilized and the bonding surface W2j is cleaned (process S207). The hydrophilization and the cleaning of the bonding surface W2j of the second substrate W2 in the process S207 is performed in the same manner as in the above-described process S202.

Then, the second substrate W2 is transferred to the bonding apparatus 41 by the transfer device 61. The second substrate W2 carried into the bonding apparatus 41 is transferred to the position adjusting device 120 by the substrate transfer device 111 via the transition 110. Then, the direction of the second substrate W2 in the horizontal direction is adjusted by the position adjusting device 120 (process S208).

Thereafter, the second substrate W2 is transferred to the second holder 141 by the substrate transfer device 111, and attracted and held by the second holder 141 (process S209). The non-bonding surface W2n of the second substrate W2 is attracted and held by the second holder 141 in a state where the notch N faces a predetermined direction, specifically, the same direction as the notch N of the first substrate W1.

Then, the position of the first substrate W1 held by the first holder 140 and the position of the second substrate W2 held by the second holder 141 are adjusted in the horizontal direction (process S210).

Thereafter, the position of the first substrate W1 held by the first holder 140 and the position of the second substrate W2 held by the second holder 141 are adjusted in the vertical direction (process S211). Specifically, the first moving device 160 moves the second holder 141 vertically upwards and thus brings the second substrate W2 closer to the first substrate W1.

As shown in FIG. 12, a gap (hereinafter, referred to as "inter-substrate gap") between the bonding surface W2j of the second substrate W2 and the bonding surface W1j of the first substrate W1 is one of the parameters of the bonding apparatus 41. The control device 70 extracts a parameter value "aaa" of a parameter type "inter-substrate gap" from the setting information stored in the storage unit, and controls the first moving device 160 to move the second holder 141 so that the gap between the bonding surfaces W1j and W2j becomes "aaa".

Then, after the attraction and holding of the first substrate W1 by the plurality of inner attraction members 302 is released (process S212), the central portion of the first substrate W1 is pressed by lowering the pressing pin 191 of the striker 190 (process S213).

When the central portion of the first substrate W1 is in contact with the central portion of the second substrate W2 and the central portion of the first substrate W1 and the central portion of the second substrate W2 are pressed by the striker 190 with a predetermined force, the bonding is started between the central portion of the first substrate W1 and the central portion of the second substrate W2. That is, since the bonding surface W1j of the first substrate W1 and the bonding surface W2j of the second substrate W2 have been modified in the processes S101 and S109, respectively, a van der Waals force (intermolecular force) is generated between the bonding surfaces W1j and W2j so that the bonding surfaces W1j and W2j are bonded to each other. Furthermore, since the bonding surface W1j of the first substrate W1 and the bonding surface W2j of the second substrate W2 have been hydrophilized in the processes S102 and S110, respectively, hydrophilic groups between the bonding surfaces W1j and W2j form hydrogen bonds and the bonding surface W1j and W2j are firmly bonded to each other. As a result, the bonding region A (see FIG. 7) is formed.

Thereafter, the bonding wave is generated between the first substrate W1 and the second substrate W2 and thus the bonding region A is expanded from the central portions toward the outer peripheral portions of the first substrate W1 and the second substrate W2 (see FIG. 13).

Then, the attraction and holding of the first substrate W1 by the four first attraction members 311 is released (process S214). Thus, the outer peripheral portion of the first substrate W1 attracted and held by the outer attraction members 301 falls. As a result, as shown in FIG. 14, the bonding surface W1j of the first substrate W1 and the bonding surface W2j of the second substrate W2 are in contact with each other over the entire surfaces, and the combined substrate T is formed.

Thereafter, the pressing pin 191 is raised to the first holder 140, and the attraction and holding of the second substrate W2 by the second holder 141 is released. Then, the combined substrate T is carried out of the bonding apparatus 41 by the transfer device 61. Thus, a series of bonding processing is ended.

Here, as shown in FIG. 12, the setting information includes, in addition to the above-mentioned "inter-substrate gap", "attraction direction", "first substrate attraction pressure", "second substrate attraction pressure", "striker pressure" and "attraction release timing" as the parameters of the bonding apparatus 41.

The "attraction direction" indicates a direction in which the outer peripheral portion of the first substrate W1 is attracted. In other words, the "attraction direction" indicates an attraction member, used to attract and hold the first substrate W1 in the processes S212 to S214, between the first attraction member 311 and the second attraction member 312. For example, if a parameter value "bbb" of a parameter type "attraction direction" indicates that only the four first attraction members 311 are used, the bonding apparatus 41 releases the attraction and holding of the first substrate W1 by the four second attraction members 312 in the process S212. Then, in the process S214, the bonding apparatus 41 releases the attraction and holding of the first substrate W1 by the four first attraction members 311. If the parameter value "bbb" indicates that the four first attraction members 311 and the four second attraction members 312 are used, the bonding apparatus 41 releases the attraction and holding of the first substrate W1 by the four first attraction members 311 and the four second attraction members 312 in the process S214.

The "first substrate attraction pressure" indicates an attraction pressure of the first substrate W1 by the first holder 140. The control device 70 extracts a parameter value "ccc" of a parameter type "first substrate attraction pressure" from the setting information stored in the storage unit. Then, the control device 70 controls the first vacuum pump 171b or the second vacuum pump 172b so that the attraction pressure of the first substrate W1 by the first holder 140 becomes "ccc".

The "second substrate attraction pressure" indicates an attraction pressure of the second substrate W2 by the second holder 141. The control device 70 extracts a parameter value "ddd" of a parameter type "second substrate attraction pressure" from the setting information stored in the storage unit. Then, the control device 70 controls a non-illustrated suction device so that the attraction pressure of the second substrate W2 by the second holder 141 becomes "ddd".

The "striker pressure" indicates a pressing force on the first substrate W1 by the striker 190. The control device 70 extracts a parameter value "eee" of a parameter type "striker pressure" from the setting information stored in the storage unit. Then, the control device 70 controls the actuator 192 so that the pressing force on the first substrate W1 by the striker 190 becomes "eee".

The "attraction release timing" indicates a timing when the attraction and holding of the first substrate W1 by the first holder 140 is released in the process S214 after the central portion of the first substrate W1 is pressed by the striker 190 in the process S213. The control device 70 extracts a parameter value "fff" of a parameter type "attraction release timing" from the setting information stored in the storage unit. Then, the control device 70 controls the first vacuum pump 171b or the second vacuum pump 172b to release the attraction and holding of the first substrate W1 by the first holder 140 at a timing when an elapsed time from when the central portion of the first substrate W1 is pressed by the striker 190 becomes "fff".

As shown in FIG. 10, when the bonding processing is ended, the combined substrate T is transferred to the inspection apparatus 31 by the transfer device 61, and a bonding state is inspected by the inspection apparatus 31 (process S102). The inspection result from the inspection apparatus 31 is output to the controller of the control device 70.

Subsequently, when the controller of the control device 70 acquires the inspection result from the inspection apparatus 31 (process S103), the controller determines whether or not uniformity of the combined substrate T satisfies a target condition based on the acquired inspection result (process S104).

Here, the uniformity of the combined substrate T indicates a small amount of non-linear distortion, specifically, a small variation in the direction and the degree of distortion among the measurement points. The target condition is, for example, that the variation in the direction and the degree of distortion among the measurement points is 3σ and 100 nm or less.

When the controller determines that the uniformity of the combined substrate T satisfies the target condition (process S104, Yes), the processing is ended.

When the uniformity of the combined substrate T does not satisfy the target condition (process S104, No), the parameters of the bonding apparatus 41 are adjusted.

Specifically, the controller includes a parameter changing unit. The parameter changing unit changes at least one of the parameters based on the inspection result acquired from the inspection apparatus 31 and trend information to be described later.

First, the parameter changing unit selects one of a plurality of zones set on the plate surface of the combined substrate T (process S105).

FIG. 15 is a diagram illustrating an example of the plurality of zones set on the plate surface of the combined substrate T. FIG. 15 also shows the inspection result from the inspection apparatus 31. As described above, the inspection result from the inspection apparatus 31 is represented by the direction and the length of the arrow.

As shown in FIG. 15, five types of zones including a central zone Z0, a 45° outer peripheral zone Z1, a 90° outer peripheral zone Z2, a 45° intermediate zone Z3, and a 90° intermediate zone Z4 are set on the plate surface of the combined substrate T.

The central zone Z0 is a zone including the central portion of the plate surface of the combined substrate T. The 45° outer peripheral zone Z1 is a zone including the outer peripheral portion of the plate surface of the combined substrate T in the 45° direction. The 90° outer peripheral zone Z2 is a zone including the outer peripheral portion of the plate surface of the combined substrate T in the 90° direction. The 45° intermediate zone Z3 is a zone including an intermediate portion between the 45° outer peripheral zone Z1 and the central zone Z0. The 90° intermediate zone Z4 is a zone including an intermediate portion between the 90° outer peripheral zone Z2 and the central zone Z0.

If the first substrate W1 and the second substrate W2 are the single crystalline silicon wafers, the distortion occurring in the combined substrate T shows the same tendency in each of the central zone Z0, the 45° outer peripheral zone Z1, the 90° outer peripheral zone Z2, the 45° intermediate zone Z3 and the 90° intermediate zone Z4. For example, as shown in FIG. 15, it can be seen that a distortion pattern in the 45° outer peripheral zone Z1 appears on the outer peripheral portion of the combined substrate T at a cycle of 90°. That is, it can be seen that the same distortion pattern appears on the outer peripheral portion of the combined substrate T in the directions of 45°, 135°, 225° and 315°.

Therefore, the parameters can be efficiently adjusted by setting the zones including the 45° outer peripheral zone Z1, the 90° outer peripheral zone Z2, the 45° intermediate zone Z3 and the 90° intermediate zone Z4 on the plate surface of the combined substrate T.

In the process S105, the controller selects a zone having the highest degree of distortion in the plurality of zones Z0 to Z4 based on the inspection result. By preferentially selecting the zone having the highest degree of distortion, it is possible to satisfy the target condition with, for example, a smaller number of adjustments. Therefore, it is possible to efficiently adjust the parameters.

In addition, each of the 45° outer peripheral zone Z1, the 90° outer peripheral zone Z2, the 45° intermediate zone Z3 and the 90° intermediate zone Z4 have four zones showing the same tendency, whereas the central zone Z0 has only one zone. For this reason, the effect on the uniformity of the combined substrate T when the distortion in the central zone Z0 is reduced is smaller than the effect on the uniformity of the combined substrate T when the distortion in the other zones Z1 to Z4 is reduced. Therefore, in the process S105, the controller may select a zone having the highest degree of distortion from the zones Z1 to Z4 except the central zone Z0 among the plurality of zones Z0 to Z4. Further, only the zones Z1 to Z4 except the central zone Z0 may be set on the plate surface of the combined substrate T.

Typically, the degree of distortion tends to be highest in the 45° outer peripheral zone Z1 or the 90° outer peripheral zone Z2 among the 45° outer peripheral zone Z1, the 90° outer peripheral zone Z2, the 45° intermediate zone Z3 and the 90° intermediate zone Z4. Therefore, in the process S105, the controller may select a zone having the highest degree of distortion from the 45° outer peripheral zone Z1 and the 90° outer peripheral zone Z2.

Subsequently, the controller selects the parameter to be changed based on the inspection result for the zone selected in the process S105 and the trend information to be described later (process S106).

Hereinafter, the contents of the trend information will be described with reference to FIG. 16. FIG. 16 is a diagram illustrating an example of the trend information.

As shown in FIG. 16, the trend information is information indicating, for each parameter of the bonding apparatus 41, a tendency of change in the direction and the degree of distortion when the parameter is changed. Herein, among arrows shown in FIG. 16, white arrows indicate outward distortion of the combined substrate T and hatched arrows indicate inward distortion of the combined substrate T. In FIG. 16, the degree of distortion is represented by the size of the arrow.

The trend information of "inter-substrate gap" indicates that when the inter-substrate gap is widened, the distortion in the 45° outer peripheral zone Z1 and the 90° outer peripheral zone Z2 changes to the inward distortion. Also, the trend information of "inter-substrate gap" indicates that when the inter-substrate gap is widened, the distortion in the central zone Z0, the 45° intermediate zone Z3 and the 90° intermediate zone Z4 changes to the outward distortion. Further, the trend information of "inter-substrate gap" indicates that the distortion in the 45° outer peripheral zone Z1 and the 45° intermediate zone Z3 changes by a greater amount than the distortion in the central zone Z0, the 90° outer peripheral zone Z2 and the 90° intermediate zone Z4.

For example, by acquiring a difference between the inspection result when the inter-substrate gap is set to 30 μm and the inspection result when the inter-substrate gap is set to 100 μm, information on the changes in distortion when the inter-substrate gap is changed from 30 μm to 100 μm can be acquired. This information is similarly acquired, for example, when the inter-substrate gap is changed from 30 μm to 150 μm and when it is changed from 30 μm to 180 μm. By comparing such information, the trend information of "inter-substrate gap" indicating the tendency of change in distortion when the inter-substrate gap is widened is created.

Further, for example, in the trend information of "inter-substrate gap" when the inter-substrate gap is narrowed, the direction of distortion is opposite to the direction of distortion in the trend information of "inter-substrate gap" when the inter-substrate gap is widened.

The trend information of "attraction direction" indicates that when the attraction direction is changed from 45° directional attraction using only the first attraction members 311 to the entire circumferential attraction using the first attraction members 311 and the second attraction members 312, the distortion in the 45° outer peripheral zone Z1 changes to the inward distortion. Further, the trend information of "attraction direction" indicates that the distortion in the 90° outer peripheral zone Z2 and the 90° intermediate zone Z4 changes to the outward distortion. Furthermore, the trend information of "attraction direction" indicates that distortion in the 45° outer peripheral zone Z1 and the 90° outer peripheral zone Z2 changes by a greater amount than the distortion in the 90° intermediate zone Z4.

For example, based on a case where the attraction pressure of the first attraction members 311 is set to −80 kpa and the attraction pressure of the second attraction members 312 is set to 0 kpa, the tendency of the change in distortion when the attraction pressure of the second attraction members 312 is changed to −20 kpa, −40 kpa, −60 kpa and −80 kpa is examined. Thus, the trend information of "attraction direction" is created.

Further, for example, in the trend information of "attraction direction" when the attraction direction is changed from the entire circumferential attraction to the 45° directional attraction, the direction of distortion is opposite to the direction of distortion in the trend information of "attraction direction" when the attraction direction is changed from the 45° directional attraction to the entire circumferential attraction.

The trend information of "first substrate attraction pressure" indicates that when the attraction pressure of the first substrate W1 by the first holder 140 is decreased, the distortion in the 45° outer peripheral zone Z1 and the 45° intermediate zone Z3 changes to the inward distortion. Further, the trend information of "first substrate attraction pressure" indicates that when the attraction pressure of the first substrate W1 by the first holder 140 is decreased, distortion in the 90° outer peripheral zone Z2 changes to the outward distortion.

For example, trend information of "first substrate attraction pressure" is created by examining the tendency of the change in distortion when the attraction pressure of the first substrate W1 is changed from −80 kpa to −60 kpa, from −80 kpa to −40 kpa and from −80 kpa to −20 kpa.

Further, for example, in the trend information of "first substrate attraction pressure" when the attraction pressure of the first substrate W1 is increased, the direction of distortion is opposite to the direction of distortion in the trend information of "first substrate attraction pressure" when the attraction pressure of the first substrate W1 is decreased.

The trend information of "second substrate attraction pressure" indicates that when the attraction pressure of the second substrate W2 by the second holder 141 is decreased, the distortion in the 45° outer peripheral zone Z1, the 45° intermediate zone Z3 and the 90° intermediate zone Z4 changes to the inward distortion. Further, the trend information of "second substrate attraction pressure" indicates that when the attraction pressure of the second substrate W2 by the second holder 141 is decreased, the distortion of the 90° outer peripheral zone Z2 changes to the outward distortion. Also, the trend information of "second substrate attraction pressure" indicates that the distortion in the 90° outer peripheral zone Z2 changes by a greater amount than the distortion in the 45° outer peripheral zone Z1, the 45° intermediate zone Z3 and the 90° intermediate zone Z4.

For example, the trend information of "second substrate attraction pressure" is created by examining the tendency of the change in distortion when the attraction pressure of the second substrate W2 is changed from −80 kpa to −60 kpa, from −80 kpa to −40 kpa and from −80 kpa to −20 kpa.

Further, for example, in the trend information of "second substrate attraction pressure" when the attraction pressure of the second substrate W2 is increased, the direction of distortion is opposite to the direction of distortion in the trend information of "second substrate attraction pressure" when the attraction pressure of the second substrate W2 is decreased.

The trend information of "striker pressure" indicates that when the pressing force of the striker 190 is increased, the distortion in the central zone Z0 changes to the outward distortion. Also, the trend information of "striker pressure" indicates that even if the pressing force of striker 190 is changed, the distortion in the 45° outer peripheral zone Z1, the 90° outer peripheral zone Z2, the 45° intermediate zone Z3 and the 90° intermediate zone Z4 does not change.

For example, in the trend information of "striker pressure" when the pressing force of the striker 190 is decreased, the direction of distortion is opposite to the direction of distortion in the trend information of "striker pressure" when the pressing force of the striker 190 is increased.

The trend information of "attraction release timing" indicates that when the attraction release timing is advanced, the distortion in the 45° outer peripheral zone Z1 changes to the inward distortion and the distortion in the 90° outer peripheral zone Z2, the 45° intermediate zone Z3 and the 90° intermediate zone Z4 changes to the outward distortion. Further, the trend information of "attraction release timing" indicates that the distortion in the 45° outer peripheral zone Z1 changes by a greater amount than the distortion in the 90° outer peripheral zone Z2, the 45° intermediate zone Z3 and the 90° intermediate zone Z4.

For example, the trend information of "attraction release timing" is created by examining the tendency of the change in distortion when the attraction release timing is changed from 9 seconds to 7 seconds, 5 seconds and 3 seconds.

Further, for example, in the trend information of "attraction release timing" when the attraction release timing is delayed, the direction of distortion is opposite to the direction of distortion in the trend information of "attraction release timing" when the attraction release timing is advanced.

The controller selects, for example, the trend information indicating the change in distortion to the direction opposite to the direction of distortion indicated in the inspection result acquired in the process S103 for the zone selected in the process S105. Then, the controller selects a parameter corresponding to the selected trend information as a parameter to be changed.

Subsequently, the controller changes the parameter selected in the process S106 (process S107). Specifically, the controller changes the parameter to the same direction as the changed direction of the parameter indicated by the selected trend information. For example, if the trend information for a case where the "inter-substrate gap" shown in FIG. 16 is widened is selected, the controller changes the parameter value of the parameter type "inter-substrate gap" included in the setting information shown in FIG. 12 in a direction in which the inter-substrate gap is widened. Further, the controller changes the parameter value by a specified value predetermined for each parameter. That is, the controller changes the parameter value of the parameter type "inter-substrate gap" included in the setting information shown in FIG. 12 by the specified value (for example, 50 μm).

When the controller changes the parameter in the process S107, the controller returns to the process S101 and repeats the processes S101 to S107 until it is determined in the process S104 that the uniformity of the combined substrate T satisfies the target condition.

Here, specific examples of a parameter changing processing will be described with reference to FIG. 17 to FIG. 20. FIG. 17 to FIG. 20 are explanatory diagrams of specific examples of the parameter changing processing.

Figure 17:
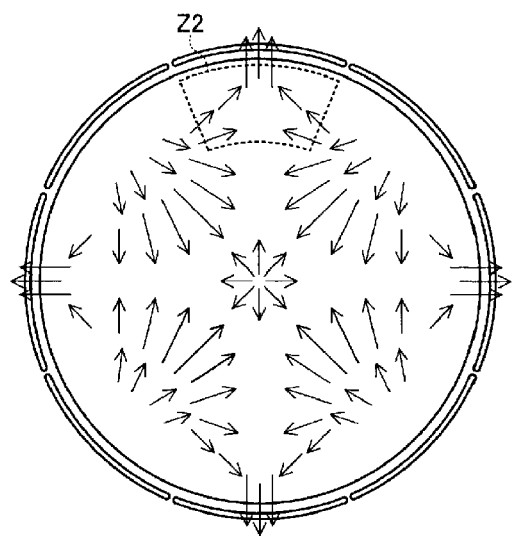
FIG. 17 is an explanatory diagram of a specific example of a parameter changing processing.

For example, it is assumed that the inspection result shown in FIG. 17 is acquired in the process S103. Here, the inspection result shown in FIG. 17 is the inspection result of the bonding processing performed in the process S101 by using the first attraction members 311 and the second attraction members 312 to attract the outer peripheral portion of the first substrate W1 along the entire circumference.

The controller selects the 90° outer peripheral zone Z2 having the highest degree of distortion from the plurality of zones Z0 to Z4 based on the inspection result shown in FIG. 17. Further, the controller selects the parameter "attraction direction" having the trend information indicating that the direction of distortion is opposite to the direction of distortion in the selected 90° outer peripheral zone Z2, i.e., inwards.

As shown in FIG. 16, the parameter having the trend information indicating that the direction of distortion in the 90° outer peripheral zone Z2 is inward includes "inter-substrate gap", "first substrate attraction pressure", "second substrate attraction pressure" and "attraction release timing" in addition to "attraction direction". In such a case, for example, the controller may display these parameter types on the display unit and allow the user to determine which parameter is selected. Further, the controller may select the parameter in consideration of the degree of distortion as well as the direction of distortion. Furthermore, the controller may select the parameter in consideration of an influence on a zone other than the zone of interest (herein, the 90° outer peripheral zone Z2). Alternatively, a plurality of parameters may be prioritized in advance and the parameter having the highest priority may be selected from a plurality of candidates to be selected.

Figure 18:
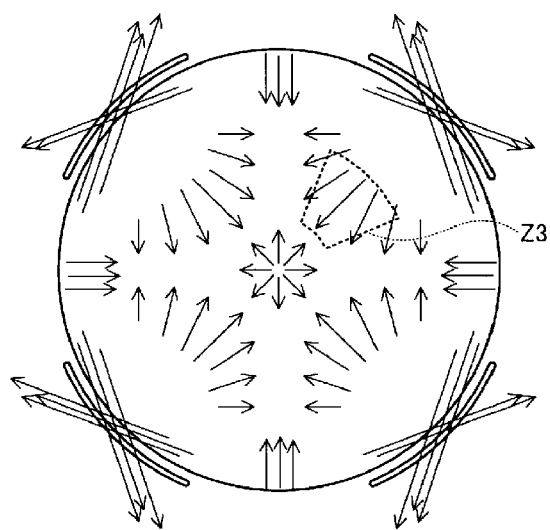
FIG. 18 is an explanatory diagram of a specific example of the parameter changing processing.

Thereafter, the controller changes the parameter value of the parameter type "attraction direction" in the setting information stored in the storage unit from the entire circumferential attraction to the 45° directional attraction. Then, the controller performs the bonding processing again with the changed parameter and acquires the inspection result again from the inspection apparatus 31. As a result, as shown in FIG. 18, the inspection result indicating that the direction of distortion in the 45° outer peripheral zone Z1 and the 90° outer peripheral zone Z2 has changed from outwards to inwards compared to the inspection result shown in FIG. 17 is acquired.

Subsequently, the controller selects the 45° intermediate zone Z3 having the highest degree of distortion from the plurality of zones Z0 to Z4 based on the inspection result shown in FIG. 18. Further, the controller selects the parameter "inter-substrate gap" having the trend information indicating that the direction of distortion is opposite to the direction of distortion in the selected 45° intermediate zone Z3, i.e., outwards.

Figure 19:
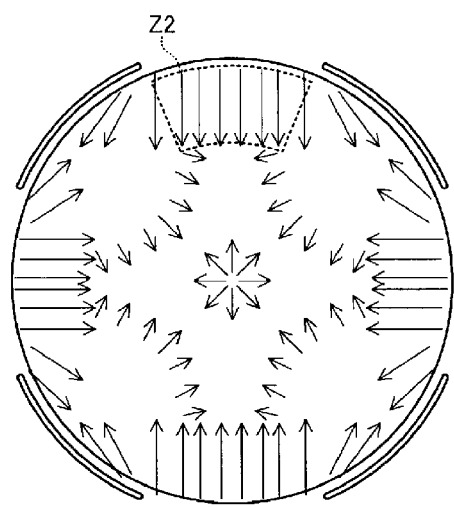
FIG. 19 is an explanatory diagram of a specific example of the parameter changing processing.

Then, the controller changes the parameter value of the parameter type "inter-substrate gap" in the setting information stored in the storage unit by a specified value in the direction in which the inter-substrate gap is widened. Thereafter, the controller performs the bonding processing again with the changed parameter and acquires the inspection result again from the inspection apparatus 31. As a result, as shown in FIG. 19, the inspection result indicating that the degree of distortion in the 45° intermediate zone Z3 has been decreased compared to the inspection result shown in FIG. 18 is acquired. The inspection result shown in FIG. 19 also indicates that the direction of distortion in the 45° outer peripheral zone Z1 has changed from outwards to inwards compared to the inspection result shown in FIG. 18.

Subsequently, the controller selects the 90° outer peripheral zone Z2 having the highest degree of distortion from the plurality of zones Z0 to Z4 based on the inspection result shown in FIG. 19. Further, the controller selects the "first substrate attraction pressure" having the trend information indicating that the direction of distortion is opposite to the direction of distortion in the selected 90° outer peripheral zone Z2, i.e., outwards.

Figure 20:
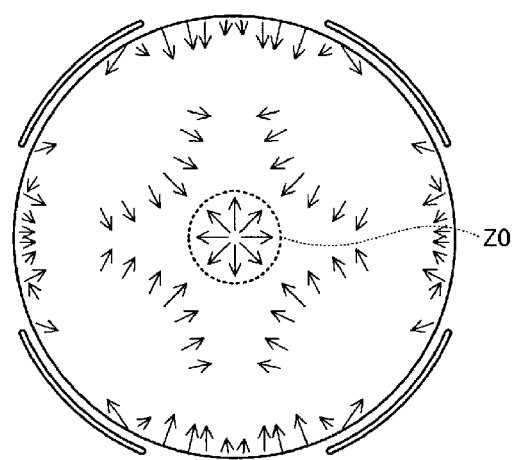
FIG. 20 is an explanatory diagram of a specific example of the parameter changing processing.

Thereafter, the controller changes the parameter value of the parameter type "first substrate attraction pressure" in the setting information stored in the storage unit by a specified value in the direction in which the first substrate attraction pressure is decreased. Then, the controller performs the bonding processing again with the changed parameter and acquires the inspection result again from the inspection apparatus 31. As a result, as shown in FIG. 20, the inspection result indicating that the degree of distortion in the 90° outer peripheral zone Z2 has been decreased compared to the inspection result shown in FIG. 19 is acquired.

Subsequently, the controller selects the central zone Z0 having the highest degree of distortion from the plurality of zones Z0 to Z4 based on the inspection result shown in FIG. 20. Further, the controller selects the "striker pressure" having the trend information indicating that the direction of distortion is opposite to the direction of distortion in the selected central zone Z0, i.e., inwards.

Figure 21:
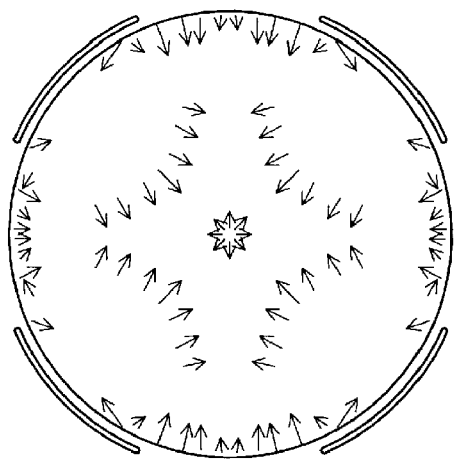
FIG. 21 is an explanatory diagram of a specific example of the parameter changing processing.

Thereafter, the controller changes the parameter value of the parameter type "striker pressure" in the setting information stored in the storage unit by a specified value in the direction in which the striker pressure is decreased. Then, the controller performs the bonding processing again with the changed parameter and acquires the inspection result again from the inspection apparatus 31. As a result, as shown in FIG. 21, the inspection result indicating that the degree of distortion in the central zone Z0 has been decreased compared to the inspection result shown in FIG. 20 is acquired.

As described above, according to the bonding system 1 of the exemplary embodiment, by repeating the parameter changing processing until the uniformity of the combined substrate T satisfies the target condition, the parameters can be optimized so that the combined substrate T with less distortion is fabricated.

Modification Example

In the above-described exemplary embodiment, the parameters are changed and the bonding processing is repeated with the changed parameter until the uniformity of the combined substrate T satisfies the target condition in the process S104. However, the present disclosure is not limited thereto, and the bonding system 1 may change the parameters at once without performing the bonding processing.

For example, the controller may predict the inspection result for a case where the bonding processing is performed with the parameters changed in the process S107 based on the trend information, and may further change at least one of the plurality of parameters based on the predicted inspection result and the trend information.

As described above, by predicting the inspection result, the plurality of parameters can be changed at once without actually performing the bonding processing. Therefore, it is possible to efficiently adjust the parameters.

In this case, the control device 70 may store correlation information indicating the correlation between the variation amount in the parameter and the change amount in the degree of distortion in the storage unit. The correlation information is created based on, for example, the inspection result when the bonding processing is performed with the parameter value set to the minimum and the inspection result when the bonding processing is performed with the parameter value set to the maximum for each parameter.

The tendency of the change in distortion when a certain parameter is changed is almost the same regardless of the substrate, but the change amount in the degree of distortion when the certain parameter is changed by a certain value differs for each substrate. Therefore, the correlation information of the target substrate may be created in advance and the parameters may be changed at once based on the trend information and the correlation information, and, thus, the parameters can be more efficiently adjusted.

Also, in the above-described exemplary embodiment, there has been described the example where the inspection apparatus 31 is placed in the processing station 3 of the bonding system 1, but the inspection apparatus 31 may be placed outside the bonding system 1. In this case, the combined substrate T is carried out of the bonding system 1 and then inspected by the external inspection apparatus 31. The inspection result from the inspection apparatus 31 is input to the control device 70 via a network such as a LAN (Local Area Network) or the like.

Further, herein, there has been described the example where the parameter is changed based on the inspection result for the single combined substrate T. However, for example, a plurality of combined substrates T may be fabricated with the same parameters and the parameters may be changed based on the average of the inspection results for the plurality of combined substrates T.

As described above, a parameter adjustment method of the bonding apparatus 41 according to the exemplary embodiment is a method for adjusting parameters by the bonding apparatus 41 that is equipped with the first holder 140 that attracts and holds the first substrate W1 from above, the second holder 141 that is placed under the first holder 140 and attracts and holds the second substrate W2 from below, an adjustment unit (for example, the first moving device 160) that adjusts a gap between the first holder 140 and the second holder 141 and the striker 190 that presses the central portion of the first substrate W1 from above to be brought into contact with the second substrate W2, adjusts the gap by means of the adjustment unit, and bonds the first substrate W1 and the second substrate W2 to each other by bringing the central portion of the first substrate W1 attracted and held by the first holder 140 into contact with the second substrate W2 attracted and held by the second holder 141 by means of the striker 190, and the parameter adjustment method includes an acquisition process and a parameter changing process. In the acquisition process, an inspection result indicating the direction and degree of distortion occurring in the combined substrate T in which the first substrate W1 and the second substrate W2 are bonded by the bonding apparatus 41 is acquired from the inspection apparatus 31 configured to inspect the combined substrate T. In the parameter changing process, at least one of a plurality of parameters including at least one of a gap (for example, "inter-substrate gap"), an attraction pressure of the first substrate W1 by the first holder 140 (for example, "first substrate attraction pressure"), an attraction pressure of the second substrate W2 by the second holder 141 (for example, "second substrate attraction pressure") or a pressing force of the first substrate W1 by the striker 190 (for example, "striker pressure") is changed based on trend information indicating a tendency of change in the direction and degree of distortion when each of the parameters is changed and the inspection result acquired in the acquisition process.

As described above, by changing the parameters of the bonding apparatus 41 based on the trend information indicating the tendency of change in the direction and degree of distortion when the parameters are changed and the inspection result for the combined substrate T from the inspection apparatus 31, the parameters of the bonding apparatus 41 can be optimized. Therefore, according to the parameter adjustment method of the bonding apparatus 41 of an exemplary embodiment, it is possible to fabricate the combined substrate T with less distortion.

Further, in the parameter changing process, one of a plurality of zones (for example, the central zone Z0, the 45° outer peripheral zone Z1, the 90° outer peripheral zone Z2, the 45° intermediate zone Z3 and the 90° intermediate zone Z4) set on the plate surface of the combined substrate T may be selected and at least one of the plurality of parameters may be changed based on an inspection result for the selected zone and trend information.

By selecting one from the plurality of zones and changing a parameter to reduce distortion in the selected zone, it is possible to fabricate a combined substrate with less distortion.

Further, in the parameter changing process, a zone having the highest degree of distortion may be selected from among the plurality of zones based on the inspection result.

By preferentially selecting the zone having the highest degree of distortion, it is possible to satisfy the target condition with, for example, a smaller number of adjustments. Therefore, it is possible to efficiently adjust the parameters.

The first substrate W1 and the second substrate W2 may be single crystalline silicon wafers each having a crystal direction of [100] on the surface. In this case, if a direction from the central portion of the first substrate W1 toward a [0-11] crystal direction parallel to the surface of the first substrate W1 is defined as 0°, the plurality of zones may include the 45° outer peripheral zone Z1 that is an outer peripheral portion in a direction of 45°, the 90° outer peripheral zone Z2 that is an outer peripheral portion in a direction of 90°, the 45° intermediate zone Z3 that is an intermediate portion between the 45° outer peripheral zone Z1 and the central portion, and the 90° intermediate zone Z4 that is an intermediate portion between the 90° outer peripheral zone Z2 and the central portion.

If the first substrate W1 and the second substrate W2 are the above-described single crystalline silicon wafers, distortion occurring in the combined substrate T shows the same tendency in each of the 45° outer peripheral zone Z1, the 90° outer peripheral zone Z2, the 45° intermediate zone Z3 and the 90° intermediate zone Z4. For this reason, the parameters can be efficiently adjusted by setting a plurality of zones including the 45° outer peripheral zone Z1, the 90° outer peripheral zone Z2, the 45° intermediate zone Z3 and the 90° intermediate zone Z4 on the plate surface of the combined substrate T.

Further, the first holder 140 may include the four first attraction members 311 arranged at an interval of 90° based on the direction of 45° and configured to attract and hold the outer peripheral portion of the first substrate W1 and the four second attraction members 312 arranged at an interval of 90° based on the direction of 0° and configured to attract and hold the outer peripheral portion of the first substrate W1. In this case, the plurality of parameters includes an attraction member (for example, "attraction direction") to be used for attracting and holding the first substrate W1 among the first attraction members 311 and the second attraction members 312.

A distortion pattern in the combined substrate T differs for when the first substrate W1 is attracted and held using only the first attraction members 311 and when the first substrate W1 is attracted and held using the first attraction members 311 and the second attraction members 312. For example, by performing the bonding processing while attracting and holding the first substrate W1 using only the four first attraction members 311 of the plurality of outer attraction members 301, it is possible to suppress distortion caused by anisotropy of physical properties of the first substrate W1. For this reason, an attraction member to be used for attracting and holding the first substrate W1 is changed based on the inspection result and the trend information, and, thus, a distortion pattern in the combined substrate T is changed. Therefore, the combined substrate T with less distortion can be fabricated.

Further, the plurality of parameters may include a timing (for example, "attraction release timing") when attraction and holding of the first substrate W1 by the first holder 140 is released after the central portion of the first substrate W1 attracted and held by the first holder 140 is pressed by the striker 190.

A distortion pattern in the combined substrate T is changed depending on a timing when attraction and holding of the first substrate W1 by the first attraction members 311 is released. For this reason, a timing when attraction and holding of the first substrate W1 is released is changed based on the inspection result and the trend information, and, thus, a distortion pattern in the combined substrate T is changed. Therefore, the combined substrate T with less distortion can be fabricated.

The parameter adjustment method according to the exemplary embodiment may include a reacquisition process and a determination process. In the reacquisition process, an inspection result for the combined substrate T bonded by the bonding apparatus 41 after the parameter changing process is acquired from the inspection apparatus 31. In the determination process, it is determined whether or not the uniformity of the combined substrate T satisfies the target condition based on the inspection result acquired in the reacquisition process. In this case, the parameter changing process and the reacquisition process may be repeated until it is determined in the determination process that the uniformity of the combined substrate T satisfies the target condition.

As described above, by repeating the parameter changing process and the reacquisition process until the uniformity of the combined substrate T satisfies the target condition, the parameters can be optimized.

The parameter adjustment method according to the exemplary embodiment may further include a prediction process for predicting an inspection result for a case where the first substrate W1 and the second substrate W2 are bonded by the bonding apparatus 41 after the parameter changing process, based on the trend information. In this case, in the parameter changing process, at least one of the plurality of parameters may be further changed based on the inspection result predicted in the prediction process and the trend information.

As described above, by predicting the inspection result, the plurality of parameters can be changed at once without actually performing the bonding processing. Therefore, it is possible to efficiently adjust the parameters.

Further, in the prediction process, the inspection result for the case where it is assumed that the first substrate W1 and the second substrate W2 are bonded by the bonding apparatus 41 after the parameter changing process may be predicted based on the trend information and correlation information indicating the correlation between a variation in the parameter and the amount of change in the degree of distortion.

As described above, by using the correlation information, it is possible to more efficiently adjust the parameters.

The exemplary embodiments disclosed herein are illustrative in all aspects and do not limit the present disclosure. In fact, the above exemplary embodiments can be embodied in various forms. Further, the above-described exemplary embodiments may be omitted, substituted, or changed in various forms without departing from the scope and spirit of the appended claims.

EXPLANATION OF REFERENCE NUMERALS

According to the present disclosure, it is possible to fabricate the combined substrate with less distortion in the bonding apparatus configured to fabricate the combined substrate by bonding the first substrate and the second substrate.

I claim:

1. A parameter adjustment method of a bonding apparatus, the bonding apparatus including a first holder configured to attract and hold a first substrate from above; a second holder placed under the first holder and configured to attract and hold a second substrate from below; an adjustment device configured to adjust a gap between the first holder and the second holder; and a striker configured to press a central portion of the first substrate from above to be brought into contact with the second substrate, the bonding apparatus being configured to bond the first substrate and the second substrate to each other by adjusting the gap with the adjustment device and then bringing the central portion of the first substrate attracted and held by the first holder into contact with the second substrate attracted and held by the second holder with the striker, the parameter adjustment method comprising:
  acquiring, from an inspection apparatus configured to inspect a combined substrate in which the first substrate and the second substrate are bonded by the bonding apparatus, an inspection result indicating a direction and a degree of distortion occurring in the combined substrate;
  changing at least one of multiple parameters including at least one of the gap, an attraction pressure of the first substrate by the first holder, an attraction pressure of the second substrate by the second holder or a pressing force on the first substrate by the striker, based on trend information indicating a tendency of a change in the direction and the degree of the distortion when each of the multiple parameters is changed and the inspection result acquired in the acquiring of the inspection result;
  reacquiring, from the inspection apparatus, the inspection result on the combined substrate bonded by the bonding apparatus after the changing of the at least one of the multiple parameters; and
  determining whether or not uniformity of the combined substrate satisfies a target condition based on the inspection result acquired in the reacquiring of the inspection result,
  wherein the changing of the at least one of the multiple parameters and the reacquiring of the inspection result are repeated until it is determined in the determining of whether or not the uniformity of the combined substrate satisfies the target condition that the uniformity of the combined substrate satisfies the target condition.

2. The parameter adjustment method of the bonding apparatus of claim 1,
  wherein in the changing of the at least one of the multiple parameters, one of multiple zones set on a plate surface of the combined substrate is selected and the at least one of the multiple parameters is changed based on the inspection result on the selected zone and the trend information.

3. The parameter adjustment method of the bonding apparatus of claim 2,
  wherein in the changing of the at least one of the multiple parameters, a zone having a highest degree of the distortion is selected from the multiple zones based on the inspection result.

4. The parameter adjustment method of the bonding apparatus of claim 2,
  wherein the first substrate and the second substrate are single crystalline silicon wafers each having a crystal direction of [100] on a surface thereof, and
  when a direction from the central portion of the first substrate toward a [0-11] crystal direction parallel to the surface of the first substrate is defined as 0°, the multiple zones includes a 45° outer peripheral zone as an outer peripheral portion in a direction of 45°, a 90° outer peripheral zone as an outer peripheral portion in a direction of 90°, a 45° intermediate zone as an intermediate portion between the 45° outer peripheral zone and the central portion, and a 90° intermediate zone as an intermediate portion between the 90° outer peripheral zone and the central portion.

5. The parameter adjustment method of the bonding apparatus of claim 4,
  wherein the first holder includes:
  four first attraction members arranged at an interval of 90° based on the direction of 45° and configured to attract and hold the outer peripheral portion of the first substrate; and
  four second attraction members arranged at an interval of 90° based on the direction of 0° and configured to attract and hold the outer peripheral portion of the first substrate, and
  wherein the multiple parameters includes the first attraction members and/or the second attraction members used in attracting and holding the first substrate.

6. The parameter adjustment method of the bonding apparatus of claim 5,
  wherein the multiple parameters includes a timing when the attracting and holding of the first substrate by the first holder is released after the central portion of the first substrate attracted and held by the first holder is pressed by the striker.

7. The parameter adjustment method of the bonding apparatus of claim 2, further comprising:
  predicting, based on the trend information, the inspection result when assuming the first substrate and the second substrate are bonded by the bonding apparatus after the changing of the at least one of the multiple parameters,
  wherein in the changing of the at least one of the multiple parameters, at least one of the multiple parameters is further changed based on the inspection result predicted in the predicting of the inspection result and the trend information.

8. The parameter adjustment method of the bonding apparatus of claim 7,
  wherein in the predicting of the inspection result, the inspection result when assuming the first substrate and the second substrate are bonded by the bonding apparatus after the changing of the at least one of the multiple parameters is predicted based on the trend information and correlation information indicating a correlation between a variation amount in the corresponding parameter and a change amount in the degree of the distortion.

9. A bonding system, comprising:
  a bonding apparatus configured to bond a first substrate and a second substrate;
  an inspection apparatus configured to inspect a combined substrate in which the first substrate and the second substrate are bonded by the bonding apparatus; and
  a controller configured to control a parameter of the bonding apparatus, wherein the bonding apparatus includes:

a first holder configured to attract and hold the first substrate from above;

a second holder placed under the first holder and configured to attract and hold the second substrate from below;

an adjustment device configured to adjust a gap between the first holder and the second holder; and a striker configured to press a central portion of the first substrate from above to be brought into contact with the second substrate, and wherein the controller includes:

an acquisition unit configured to acquire, from the inspection apparatus, an inspection result indicating a direction and a degree of distortion occurring in the combined substrate;

a parameter changing unit configured to change at least one of multiple parameters including at least one of the gap, an attraction pressure of the first substrate by the first holder, an attraction pressure of the second substrate by the second holder or a pressing force on the first substrate by the striker, based on trend information indicating a tendency of a change in the direction and the degree of the distortion when each of the multiple parameters is changed and the inspection result acquired by the acquisition unit; and a display controller configured to cause a display unit to display, based on the inspection result acquired by the acquisition unit, an image in which the direction of the distortion is indicated by an arrow and the degree of the distortion is indicated by at least one of a length, a thickness or a color of the arrow.

* * * * *